(12) United States Patent
Milaninia

(10) Patent No.: US 9,929,065 B2
(45) Date of Patent: Mar. 27, 2018

(54) LOW-COST PACKAGING FOR FLUIDIC AND DEVICE CO-INTEGRATION

(71) Applicant: Multerra Bio, Inc., Menlo Park, CA (US)

(72) Inventor: Kaveh M. Milaninia, San Jose, CA (US)

(73) Assignee: Multerra Bio, Inc., San Francisco, CA (US)

( * ) Notice: Subject to any disclaimer, the term of this patent is extended or adjusted under 35 U.S.C. 154(b) by 0 days.

(21) Appl. No.: 15/263,649

(22) Filed: Sep. 13, 2016

(65) Prior Publication Data

US 2017/0069555 A1 Mar. 9, 2017

Related U.S. Application Data

(63) Continuation of application No. PCT/US2015/023390, filed on Mar. 30, 2015.

(60) Provisional application No. 61/973,140, filed on Mar. 31, 2014.

(51) Int. Cl.
| | | |
|---|---|---|
| *H01L 21/44* | (2006.01) | |
| *H01L 23/04* | (2006.01) | |
| *H01L 21/50* | (2006.01) | |
| *B01L 3/00* | (2006.01) | |
| *H01L 21/52* | (2006.01) | |
| *H01L 21/56* | (2006.01) | |

(52) U.S. Cl.
CPC ........ *H01L 23/04* (2013.01); *B01L 3/502707* (2013.01); *B01L 3/502715* (2013.01); *H01L 21/50* (2013.01); *H01L 21/52* (2013.01); *H01L 21/565* (2013.01); *B01L 2300/0645* (2013.01); *H01L 2924/0002* (2013.01)

(58) Field of Classification Search
CPC .............. H01L 23/04; H01L 23/49855; H01L 2224/48091; H01L 21/52
USPC ........ 257/783, 704, 797; 438/112, 118, 124, 438/127
See application file for complete search history.

(56) References Cited

U.S. PATENT DOCUMENTS

| | | | |
|---|---|---|---|
| 4,491,377 A | 1/1985 | Pfaff | |
| 4,618,739 A | 10/1986 | Theobald | |
| 5,156,998 A | 10/1992 | Chi et al. | |
| 5,221,642 A | 6/1993 | Burns | |
| 5,324,888 A | 6/1994 | Tyler et al. | |
| 5,640,995 A * | 6/1997 | Packard | F15C 5/00 137/597 |
| 6,136,212 A * | 10/2000 | Mastrangelo | B01J 19/0093 216/27 |
| 6,165,820 A | 12/2000 | Pace | |

(Continued)

FOREIGN PATENT DOCUMENTS

EP 1281439 A1 2/2003

OTHER PUBLICATIONS

International Search Report dated Jun. 25, 2015 for International application PCT/US2015/023390.

(Continued)

*Primary Examiner* — Nitin Parekh
(74) *Attorney, Agent, or Firm* — Wilson Sonsini Goodrich & Rosati

(57) ABSTRACT

The present disclosure provides methods for packaging a chip and packaged chips in which the chip and packaging are co-planar and gap-less. In certain instances, the packaged chip has electrodes or fluidics integrated with the chip.

14 Claims, 35 Drawing Sheets

(56) References Cited

U.S. PATENT DOCUMENTS

| | | | |
|---|---|---|---|
| 6,413,474 B1 | 7/2002 | Igel et al. | |
| 6,443,179 B1 | 9/2002 | Benavides et al. | |
| 6,444,111 B1 | 9/2002 | Montgomery | |
| 6,838,689 B1 | 1/2005 | Deng et al. | |
| 6,956,283 B1 * | 10/2005 | Peterson | B81B 7/0025 |
| | | | 257/680 |
| 6,964,881 B2 * | 11/2005 | Chua | H01L 23/5389 |
| | | | 257/E21.509 |
| 8,604,603 B2 * | 12/2013 | Lau | H01L 23/055 |
| | | | 257/686 |
| 8,637,341 B2 * | 1/2014 | Otremba | H01L 21/561 |
| | | | 438/112 |
| 8,673,627 B2 | 3/2014 | Nobile et al. | |
| 8,828,208 B2 | 9/2014 | Canas et al. | |
| 2004/0087043 A1 * | 5/2004 | Lee | B81C 1/00269 |
| | | | 438/6 |
| 2004/0229418 A1 | 11/2004 | Hashimoto | |
| 2006/0043549 A1 | 3/2006 | Hsu | |
| 2006/0105499 A1 | 5/2006 | Dcamp et al. | |
| 2006/0258056 A1 | 11/2006 | Bauer | |
| 2007/0182004 A1 | 8/2007 | Rinne | |
| 2008/0023819 A1 | 1/2008 | Chia et al. | |
| 2008/0138248 A1 | 6/2008 | Viovy et al. | |
| 2008/0150164 A1 | 6/2008 | Chia | |
| 2008/0258313 A1 * | 10/2008 | Ali | B81C 1/00301 |
| | | | 257/783 |
| 2010/0122904 A1 | 5/2010 | Hassibi et al. | |
| 2010/0203676 A1 * | 8/2010 | Theuss | H01L 21/561 |
| | | | 438/109 |
| 2012/0074975 A1 | 3/2012 | Detofsky et al. | |
| 2014/0045701 A1 | 2/2014 | Esfandyarpour et al. | |
| 2014/0221249 A1 | 8/2014 | Chen et al. | |
| 2015/0076545 A1 * | 3/2015 | Nakatani | H01L 24/96 |
| | | | 257/98 |
| 2016/0003798 A1 | 1/2016 | Paik et al. | |
| 2016/0005679 A1 * | 1/2016 | Israel | H01L 24/96 |
| | | | 257/368 |

OTHER PUBLICATIONS

European Search Report dated Oct. 18, 2017 for European Patent Application No. EP15773019.3.

* cited by examiner

1404

1435

1405

1504

1709

2100

2105

2500

2505

2510

LOW-COST PACKAGING FOR FLUIDIC AND DEVICE CO-INTEGRATION

CROSS-REFERENCE

This application is a Continuation Application of PCT/US15/23390, filed Mar. 30, 2015, which claims the benefit of U.S. Provisional Patent Application Ser. No. 61/973,140, filed Mar. 31, 2014, each of which is entirely incorporated herein by reference.

BACKGROUND

This disclosure generally relates to microchips (e.g., integrated circuit (IC), micro-electromechanical systems (MEMS), and light-emitting diode (LED) chips) and their packaging. Integrated electronic and electromechanical devices have recently shown great promise in their ability to integrate many sensing and measurement components in a small, compact footprint which can be used for developing low cost and portable biochemical sensors. Although the cost of the sensor itself can be relatively cheap (e.g., less than about $1), the cost for packaging the device still remains relatively high (e.g., often orders of magnitude greater than the device itself).

Integration of microchips with a fluidics interface can be particularly costly and difficult. Currently, most integration of chips with fluidics involves packaging each of the chips separately, for example by wire-bonding of the chip into a socket and then incorporating the socket into a printed circuit board. The fluidic component can then be modified to accommodate the electronic packaging, which is a tedious and expensive method, and often is not amenable for use with complex fluidic structures.

SUMMARY

Recognized herein is the need for improved methods for packaging microchips and integrating them with electrodes and microfluidics. The methods described herein are amenable to alignment of both chip and packaging for deposition of electrical leads as well as integration of microfluidics. This is enabled using a process that results in the top surfaces of the chip and packaging being coplanar. The method allows for the integration of virtually any microfluidic architecture with an integrated electronic device.

In one aspect, a method for packaging a chip is disclosed herein. The method involves placing a chip on a planarizing surface, and placing a carrier on the planarizing surface surrounding the chip with a gap between the carrier and the chip. The method further involves closing the gap to bond the chip, thereby producing a chip-in-carrier (CiC).

In another aspect, a packaged chip is disclosed herein. The packaged chip includes a chip having a first surface, and a carrier having a second surface, wherein the carrier surrounds the chip and is bonded to the chip, such that the first surface is substantially planar with the second surface. The packaged chip includes global alignment features on the carrier which are aligned to the chip.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings or figures (also "FIG." and "FIGs." herein), of which:

DETAILED DESCRIPTION

Figure 1:
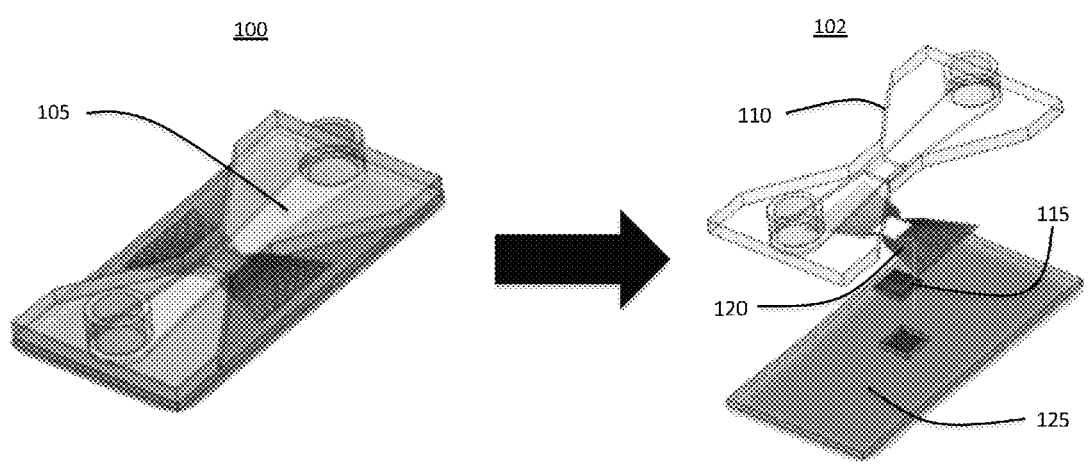
FIG. 1 shows an example of a packaged device of the present disclosure.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

The devices and methods described herein are applicable to a variety of different biosensor and biodevice systems, including but not limited to impedance and charge sensing nanopores, fluorescence microarrays, electrochemical microarrays, and MEMS-based biosensors. Additionally, the devices and methods of the present disclosure offer a number of advantages for these end-uses and others. The packaging technology described herein is also compatible with surface modifications and spotted capture probes present in various biosensors and devices.

Packaged Chips and Methods for Packaging Chips

In one aspect, a method for packaging a chip is disclosed herein. The method involves placing a chip on a planarizing surface, and placing a carrier on the planarizing surface surrounding the chip with a gap between the carrier and the chip. The method further involves closing the gap to bond the chip, thereby producing a chip-in-carrier (CiC). The step involving placing a carrier on the planarizing surface may precede the step of placing a chip on the planarizing surface. The gap may be between about 10 µm and about 50 µm in width. The gap may be closed by heating the carrier such that the carrier melts or deforms to close the gap. The carrier may be heated to a temperature that is greater than or equal to a glass transition temperature (Tg) of a material from which the carrier is comprised. The gap may be closed by contacting the carrier with a solvent such that the carrier dissolves or deforms to close the gap. The method disclosed herein may further involve evaporating the solvent. The gap may be closed by injecting an adhesive into the gap. The method may further involve applying a first pressure to the chip to hold the chip against the planarizing surface. The method may further involve applying a second pressure to the carrier to hold the carrier against the planarizing surface. The first or second pressure may be applied mechanically or by vacuum.

The carrier may be plastic. The carrier may be machined or injection molded. The carrier may be injection molded onto the planarizing surface, and the planarizing surface may be substantially planar. The planarizing surface may have a topography that is complementary to the chip and the carrier such that the chip and the carrier are co-planar when disposed on the planarizing surface. The planarizing surface may have a surface coating to improve release of the chip and the carrier from the planarizing surface. The chip may be treated to enhance bonding between the chip and the carrier. The chip may have an integrated circuit (IC) or a light-emitting diode (LED). The chip may be a micro-electromechanical system (MEMS).

In another aspect, a packaged chip is disclosed herein. The packaged chip includes a chip having a first surface, and a carrier having a second surface, wherein the carrier surrounds the chip and is bonded to the chip, such that the first surface is substantially planar with the second surface. The packaged chip includes global alignment features on the carrier which are aligned to the chip. The global alignment features may include a dowel or a hole. The dowel may be cylindrical; the hole may be round.

The packaged chip may have a first surface having an area of less than about 1 square millimeter, less than about 100 square millimeter, or less than about 10,000 square millimeters ($mm^2$). The packaged chip may have a second surface having an area of at least about 1 square centimeter, at least about 100 square centimeters, or at least about 1,000 square centimeters ($cm^2$). The packaged chip may have a ratio of the area of the second surface to the area of the first surface is at least about 1:1, at least about 5:1, at least about 10:1, at least about 15:1, at least about 20:1, at least about 30:1, at least about 40:1, at least about 50:1, at least about 75:1, or at least about 100:1. The packaged chip may have no portion of the first surface and no portion of the second surface deviate more than 10 µm from being substantially planar. The packaged chip may be laid along a planarizing surface along the first surface and the second surface, such that the gap between the planarizing surface and the first surface and the second surface is less than about 10 µm. The packaged chip may further include a local alignment feature. The chip may be aligned to global alignment features with an accuracy of about 1 to 100 µm. The carrier may be bonded to the chip without a gap. The carrier may be bonded to the chip with a gap of less than about 1 nm. The chip may have an integrated circuit (IC), a light-emitting diode (LED), or it may be a micro-electromechanical system (MEMS). The carrier may be plastic; the carrier may be injection molded to surround the chip. The carrier may be machined plastic. Optionally, the chip may not be attached to a printed circuit board.

FIG. 1 shows a perspective view 100 and a perspective exploded view 102 of the packaging system 105. The system 105 is comprised of a fluidic cap 110, integrated circuit (IC) or other chip 115, electrodes 120, and plastic carrier 125 all bonded together to create a low-cost electrically addressable, microfluidic system. Additionally, a second cap can be bonded to the bottom of the carrier 125 and optionally accessed from the top to create an additional fluidic channel, which allows access to the bottom side of the chip 115. The system 105 can have many integrated microfluidic layers (e.g., 2, 3, 4, 5, 6, 7, 8, 9, 10, or more). The system 105 can also be extended to accommodate multiple chips of the same design or different design components (e.g., IC, opto-electronic, optical, MEMS, membranes, etc.), allowing for hybrid integration of components.

Co-Planar Embedding

In one aspect of the invention, the present disclosure provides a gap-free and coplanar integration of a chip in a low-cost (e.g., plastic) carrier. The gap between the chip and the carrier can be less than about 1 µm, less than about 10 µm, or less than about 20 microns (µm). In some cases, the chip and carrier are gap-free, meaning that no gap is detectable using the technique of a leak test.

Figure 2:
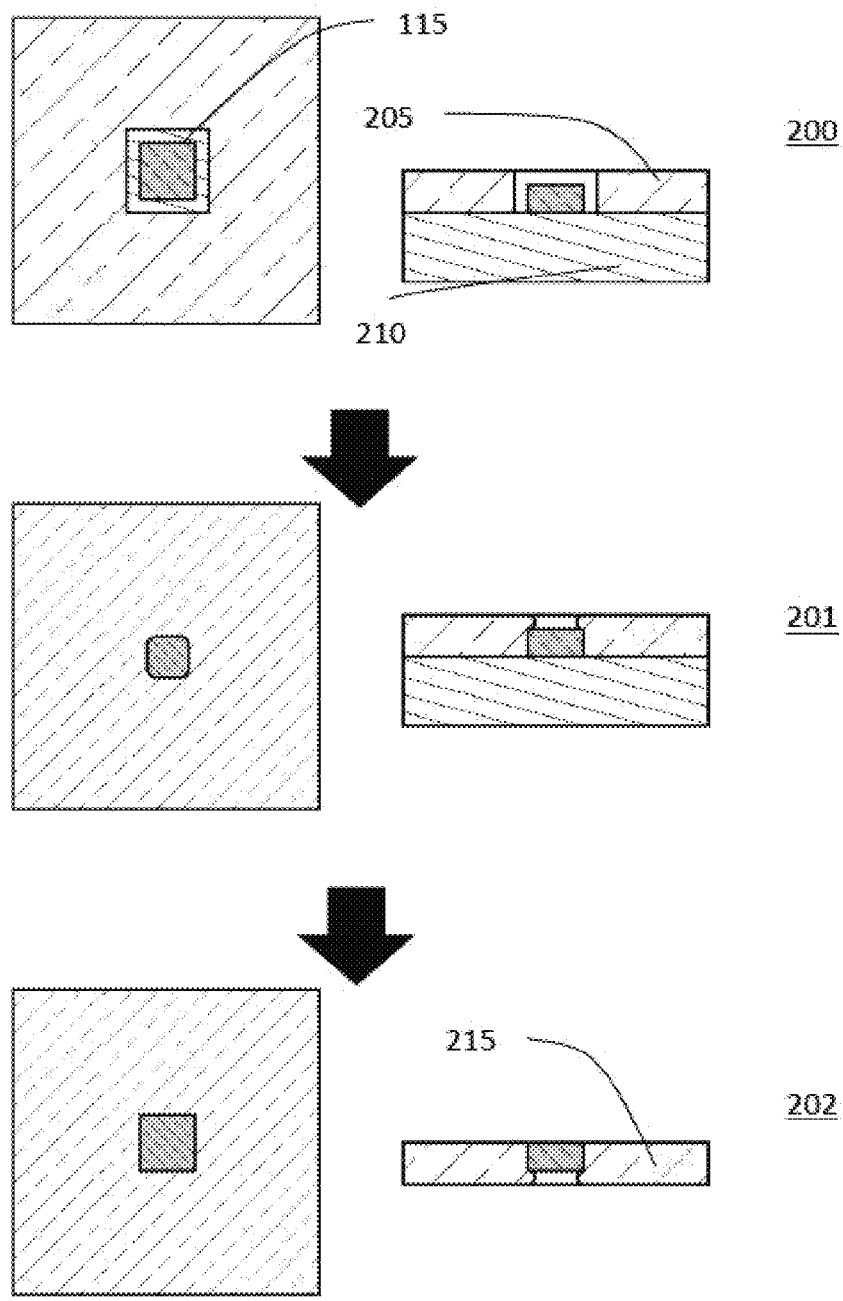
FIG. 2 shows an example of embedding a chip in a carrier.

FIG. 2 is a graphical representation of the process. The left-most panels are a top view of the process. The right-most panels are a cross sectional view of the process. Beginning from the top panels and representing a first step 200, a fabricated plastic carrier 205 is placed on a planarizing surface 210. The chip 115 is also placed in the center of carrier 205 face down against the planarizing surface 210. In a second step 201, the chip 115 is bonded to the plastic carrier 205. In a third step 202, the entire structure is released from the planarizing surface 210 to form a chip-in-carrier (CiC) 215.

The plastic carrier 205 can have a center pocket slightly larger (e.g., about 10 to 100 µm) than the footprint of the chip 115. This can accommodate chip size variation as a result of the dicing process. The pocketed plastic carrier can be made by machining a plastic sheet or directly via injection molding. The choice of plastic can be determined by the application; for example, in cases where the chip requires illumination, acrylic or cyclic olefin copolymer (COC) can be used. Prior to placement of the chip in the plastic carrier, the chip can be treated with vacuum plasma, atmospheric plasma, corona or UV/ozone to enhance bonding strength between the chip and the plastic in subsequent steps. In some cases, an adhesion promoter such as hexamethyldisilazane (HMDS) can be used to enhance bonding. A surface coating such as a detergent or dimethyloctadecylchlorosilane can be used as a mold release agent. The planarizing surface can be machined-smoothed or a precision polished, atomically flat silicon surface. For example, a 20/10 scratch-dig surface roughness can be achieved by polishing a metal surface such as stainless steel.

In some cases, the planarizing surface is not flat, but has raised and/or recessed portions that accommodate recessed and/or raised portions of the chip and/or carrier. The surface can be etched or machined to accommodate any topography. As a non-limiting example, there are some integrated circuits (ICs) processes where the top most layers of the chips are typically not polished flat. These chips often have raised features associated with the patterning of metal traces on the top most layer. These traces can be mirrored and etched into the planarizing substrate. In general, the raised and/or recessed portions of the chip can be matched on the planarizing surface such that there is little to no gap between the planarizing surface and the chip and/or carrier (e.g., a gap of less than about 1 µm, less than about 5 µm, or less than about 10 µm). In some cases, the raised and/or recessed portions can match each other such that the chip and carrier are co-planar. The chip and carrier are considered co-planar if their surfaces are within about 1 µm, within about 5 µm, or within about 10 µm of a true plane.

Any one or more of several methods can be used to integrate the chip in the plastic such that they are gap-free including, but not limited to, a low-viscosity adhesive to fill the gaps, thermal bonding, or solvent bonding.

Figure 3:
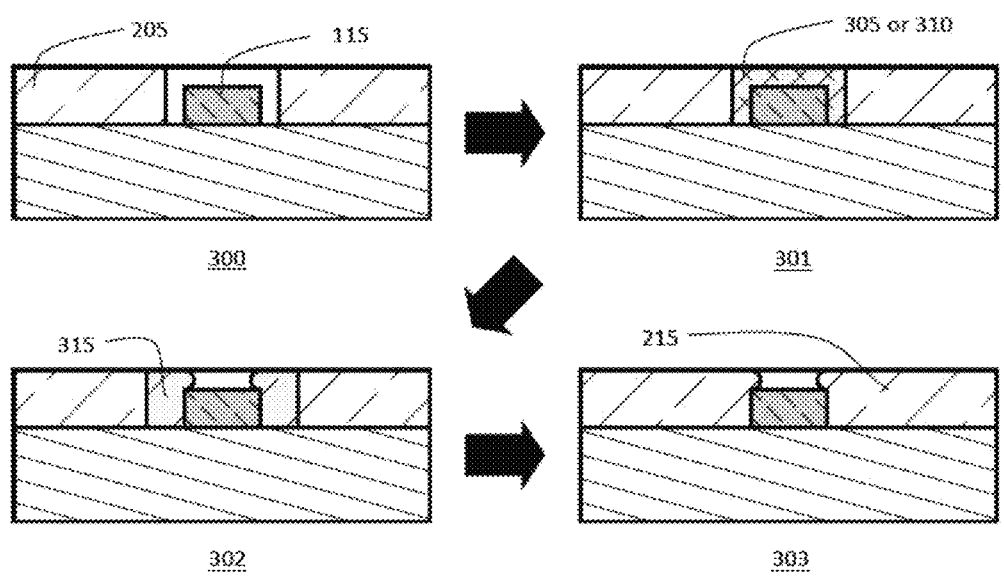
FIG. 3 shows an example of embedding a chip in a carrier using solvent or adhesive bonding.

FIG. 3 depicts an example of a process flow for solvent or adhesive bonding. The system is assembled as shown at 300 with the carrier and the chip disposed on the planarizing surface as described above in respect of FIG. 2. As depicted in a series of steps 301, 302, 303, a solvent 305 or adhesive 310 is introduced into the cavity and fills the gap between the chip 115 and the plastic carrier 205. In the case of the adhesive 310, the adhesive 310 solidifies, creating a seamless seal between chip 115 and carrier 205 to create the CiC 215 as shown at 303. In the case of the solvent 305, the solvent evaporates and the plastic reforms 315 to create the CiC 215.

In the case of solvent bonding, the solvent in the cavity can cause some of the plastic in the vicinity of the chip to dissolve and/or become flowable and fill the air-gap between the chip and the plastic carrier. Once the solvent has evaporated, the plastic re-solidifies resulting in a gap-less interface between the chip and the plastic carrier. Since this is all done while the surfaces are pressed flat against the planarizing surface, the resulting surfaces of the chip and the plastic carrier are co-planar. The type of solvent for this process is highly dependent on the particular plastic that is used, but as a non-limiting example, cyclohexane can be used with cyclic olefin copolymer (COC). In lieu of a solvent, a low-viscosity adhesive can be used to fill the gaps. The choice of adhesive is primarily based upon the particular application and requirements for thermal and mechanical stability and chemical resistance. For example, BCB (Cyclotene 4024-25, Dow Chemical Company) can be ideal for many applications because of its ease of curing, mechanical robustness, mechanical robustness, and chemical compatibility.

Figure 4:
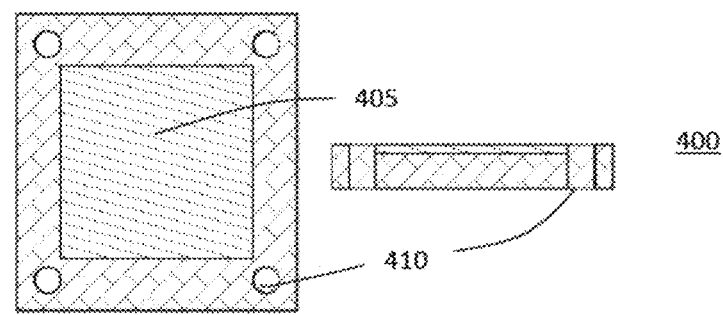
FIG. 4 shows an example of thermal embedding of a chip in a carrier using thermal bonding.
Figure 4:
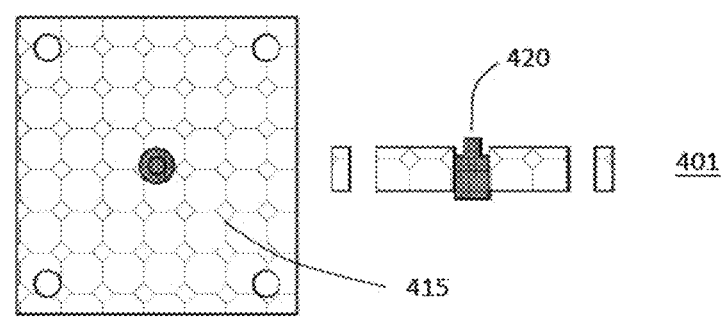
Figure 4:
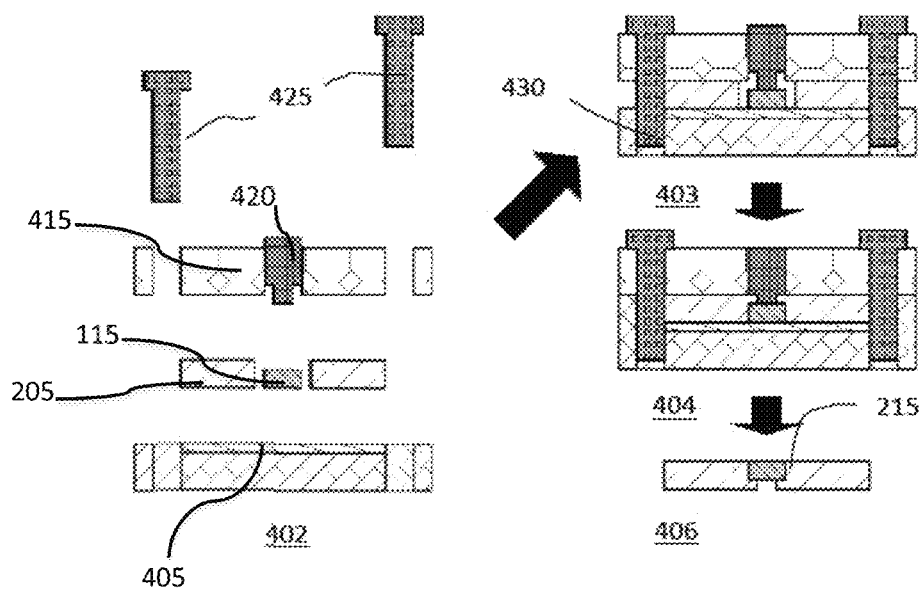

An example of the thermal bonding process of the present disclosure is shown in FIG. 4. In the first view 400, which shows a left-most panel depicting a top view and a right-most panel depicting a cross-sectional view, the bottom planarizing surface 405 is shown with threaded holes 410. The second view 401, which shows a left-most panel depicting a top view and a right-most panel depicting a cross-sectional view, shows the top pressure plate 415 with a spring plunger or set screw 420. The third view 402 is an exploded cross-sectional view of the thermal bonding system, which is comprised of the bottom planarizing plate 405, top thermal plate 415, spring plunger/set screw 420, and screws 425. The chip 115 and fabricated plastic carrier 205 are placed face down on the bottom planarizing plate, as shown and described earlier with reference to FIG. 2. Continuing with reference to FIG. 4, the assembled view 402 of the thermal bonding system 430 shows the screws 425 and top pressure plate 415 applying pressure to the carrier 205 and the spring plunger/set screw 420 applying pressure to the chip 115, both against the planarizing surface 405. The assembly can be heated 404 to facilitate thermal flow of the plastic carrier 205 until gaps between chip 115 and carrier 205 is filled. Finally, the system can be disassembled 406 to release the CiC 215.

Thermal bonding can be achieved by heating the co-planar integrated setup 404 above the glass transition temperature (Tg) of the plastic such that it flows to fill the gaps. Pressure can also be applied to facilitate faster flow and/or lower temperature bonding. Because of the difference in mechanical properties of the plastic and the chip, the thermal bonding system 430 allows for applying independent pressure on the carrier versus on the chip. Independent pressure control can be achieved by using the top pressure plate 415 to apply pressure to the plastic carrier 205 through the use of the screws 425, while a spring plunger or set screw 420 in the center can be tightened to apply a different pressure to the chip 115. The amount of pressure can be related to the torque applied to each. As a non-limiting example, and in the case of an acrylic carrier, a temperature of about 117 and about 120° C. can be desired, with an applied pressure to the carrier between about 400 and about 600 kPa.

Figure 5:
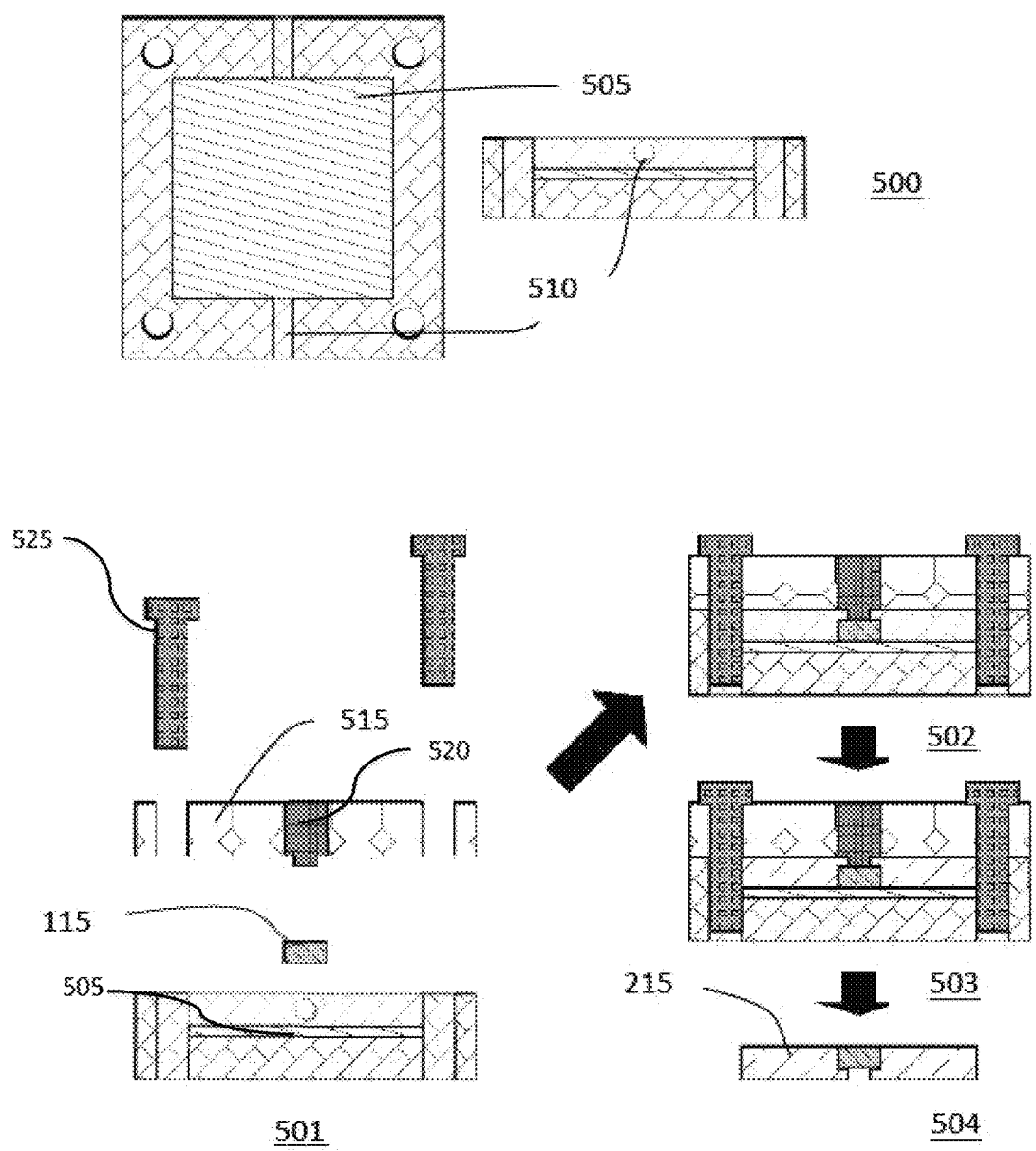
FIG. 5 shows an example of embedding a chip in a carrier using injection molding.

In some cases, the carrier can be directly injection molded or cast around the chip as shown in FIG. 5. This method can avoid the use of a pre-fabricated plastic carrier. As shown in the first view 500, which shows a left-most panel depicting a top view and a right-most panel depicting a cross-sectional view, injection molding onto the planarizing surface 505 is similar to the thermal bonding system described herein, except for the presence of injection ports 510 for plastic injection. The second view 501 is an exploded cross-sectional view of the injection molded integration system, which is comprised of the bottom injection planarizing plate 505, top thermal plate 515, spring plunger/set screw 520, and screws 525. The chip 115 is placed face down on the bottom planarizing plate 505. In the assembled view of the injection molding integration system 502, the screws 525 and top plate 515 complete the injection mold for the carrier. The spring plunger and set screw 520 apply pressure to the chip 115 against the injection planarizing surface 505 to create a sealed system. Plastic can be injection molded into system 503 to create a carrier around the chip 115. The system can be disassembled 504 to release the CiC 215.

Similar chip and mold preparations can be performed as described herein. Unlike the thermal, solvent or adhesive methods, the bottom mold 505 has ports for injecting plastic. The mold setup can require a seal between the top and bottom molds in some cases; for example, this is typically the case for most injection molding where high pressures would otherwise cause leaking.

Figure 6:
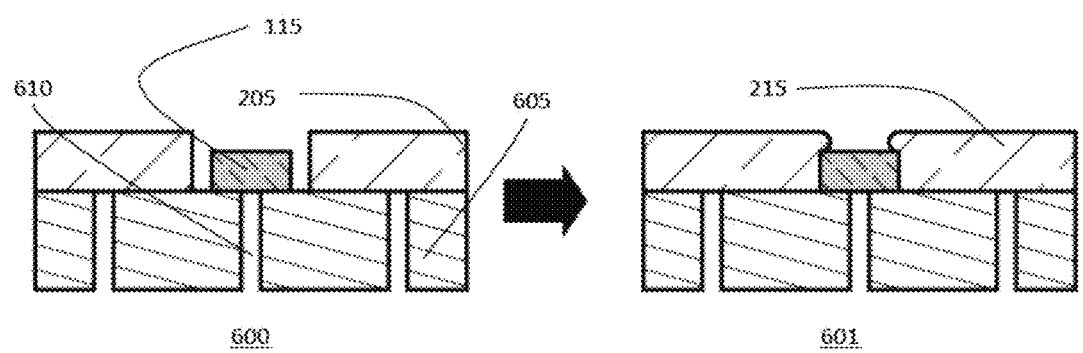
FIG. 6 shows an example of embedding using a vacuum chuck.

A vacuum can be used to hold the chip and plastic carrier in place for any of the gap-filling methods described herein. FIG. 6 shows an example of the vacuum system, with like numerals depicting like elements. The cross-sectional drawing 600 shows a vacuum planarizing surface 605 with vacuum ports 610 configured to hold chip 115 and plastic carrier 205 against the surface. Following the gap filling process, the CiC 205 made using vacuum planarizing surface and solvent or adhesive bonding is shown at 601.

Alignment of Chip to Carrier

As detailed above, and in one aspect, a method for packaging a chip is disclosed herein. The method involves placing a chip on a planarizing surface, and placing a carrier on the planarizing surface surrounding the chip with a gap between the carrier and the chip. The method further involves closing the gap to bond the chip, thereby producing a chip-in-carrier (CiC). The method may further involve a chip having a first alignment feature, the planarizing surface having a second alignment feature, and the chip being placed on the planarizing surface such that the first alignment feature is aligned with the second alignment feature. Under this method, the first alignment feature may be aligned to the second alignment feature with an accuracy of about 1 to about 100 μm. The carrier may be aligned to the planarizing surface, including by use of a dowel-in-hole alignment. Optionally, at least two dowels fit into at least two holes as between the carrier and the planarizing surface. Optionally, the carrier comprises a hole and the planarizing surface comprises a dowel, and the dowel fits in the hole when the carrier is placed on the planarizing surface. Optionally, the carrier comprises a dowel and the planarizing surface comprises a hole, and the dowel fits in the hole when the carrier is placed on the planarizing surface. Further and optionally, the carrier is injection molded onto the planarizing surface and the injection molded carrier comprises pins or holes that have a known alignment relative to the chip. Using at least one of the described methods, the chip is aligned relative to the carrier in the chip-in-carrier (CiC) with an accuracy of about 0.5 to about 100 μm.

In another aspect, described herein is a method for alignment of the different components (e.g., chip, fluidic cap, and plastic carrier) to create a chip-in-carrier (CiC) structure. Low-cost alignment is achieved by using a combination of pick-and-place alignment and dowel pin-hole or ball-grove alignment.

Figure 7A:
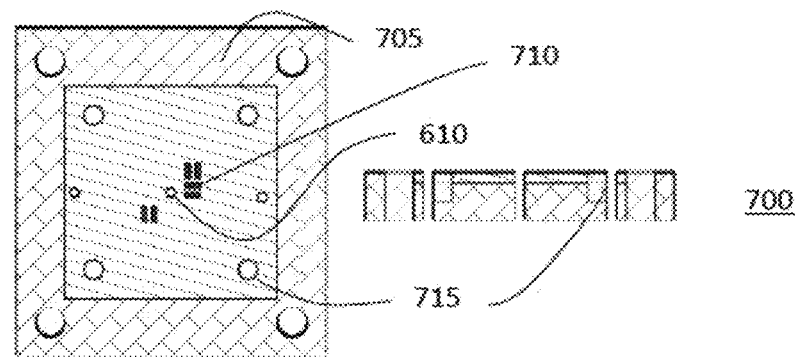
FIG. 7a and FIG. 7b show an example of alignment with an external dowel and pin-hole.
Figure 7A:
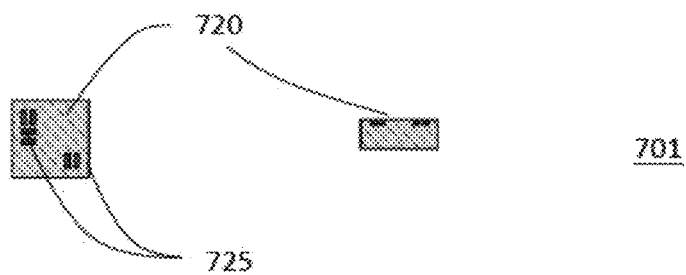
Figure 7A:
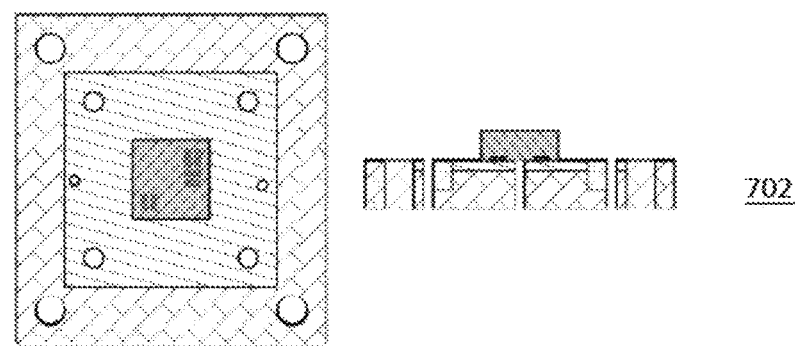
Figure 7B:
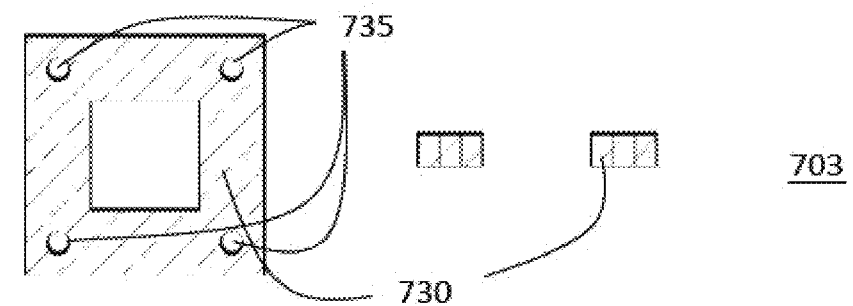
Figure 7B:
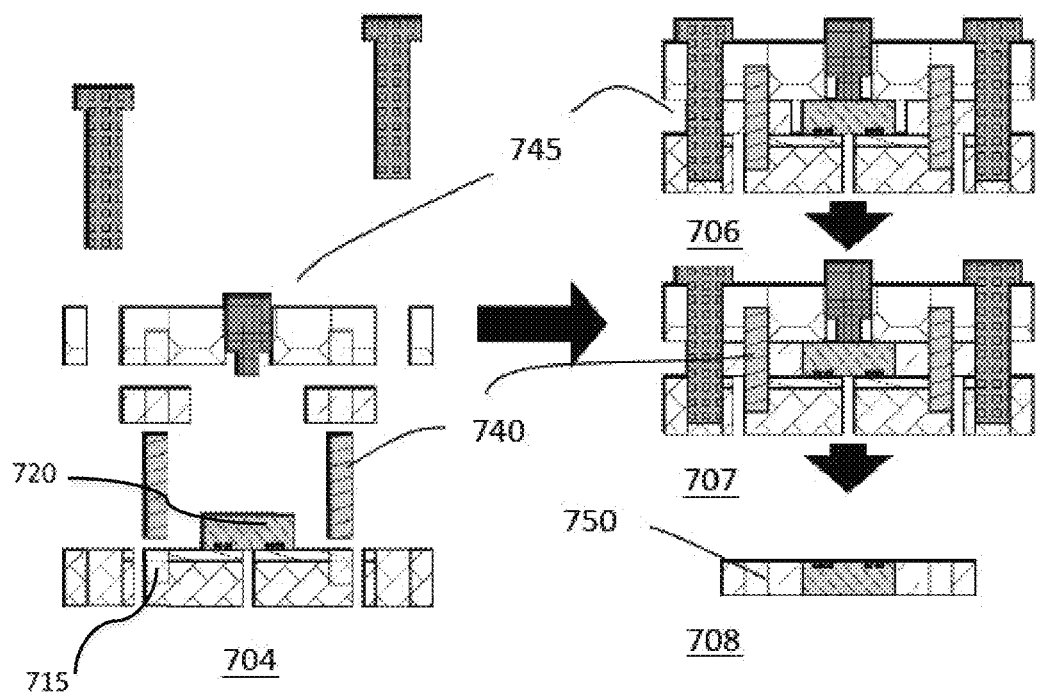

An example of a low-cost alignment of the present disclosure is shown in FIG. 7a and FIG. 7b. As shown at 700 in FIG. 7a, which shows a left-most panel depicting a top view and a right-most panel depicting a cross-sectional view, the planarizing surface 705 has two primary features: (a) chip level alignment marks 710 which can be recessed to maintain planarity when the chip is aligned; and (b) dowel-holes 715 for subsequent alignment of a plastic carrier. In this schematic, the planarizing surface 705 has vacuum holes 610 for temporarily mounting the chip or carrier. As shown at 701 in FIG. 7a, which shows a left-most panel depicting a top view and a right-most panel depicting a cross-sectional view, the chips 720 can have visible alignment marks 725 on their surface. The alignment marks on the planarizing surface 710 match these marks on the chip.

As shown at 702 in FIG. 7a, which shows a left-most panel depicting a top view and a right-most panel depicting a cross-sectional view, the chip 720 is aligned to the marks on the planarizing surface 705 with a pick and place tool and can be held in place by vacuum. As shown at 703 in FIG. 7b, which shows a left-most panel depicting a top view and a right-most panel depicting a cross-sectional view, the plastic carrier for low-cost alignment 730 also has dowel holes 735 to facilitate the low-cost alignment.

The exploded cross-sectional view 704 of FIG. 7b depicts the low-cost alignment system with external pin-holes 745 comprises the bottom planarizing surface for low-cost alignment 705 (as shown in FIG. 7a), onto which the chip 720 has been aligned. The system further comprises the top thermal plate 415, the spring plunger/set screw 420, and the screws 425 (as detailed previously in FIG. 4). Dowel-pins 740 are inserted into the dowel-holes 715 which align the carrier 730 to the bottom planarizing surface 705. The chip 720 and fabricated plastic carrier 730 are placed face down on the bottom planarizing plate as described herein. The assembled view 706 of the low-cost alignment system with external pin-holes 740 is shown. As was described previously in relation to FIG. 4, the screws 425 and top pressure plate 415 apply pressure to the carrier 730 and the spring plunger or set screw 420 applies pressure to the chip 720. The integration assembled system 707 can be thermal, solvent, or adhesive bonded. The system can be disassembled 708 to release the CiC with dowel-holes for alignment using external dowel-pins 750. The dowel-holes 735 can be used to align the chip 720 (i.e., because of their known relative position and orientation because of the bottom planarizing surface 705).

Alignment between the chip and the plastic carrier can be facilitated by modifying the bottom master mold to contain alignment marks that correspond to the chip as well as dowel-hole alignment structures that correspond to the plastic carrier. Initially, the chip can be aligned to and placed on the master mold using the chip-based alignment marks. The chip can be held into place by either friction or the use of a vacuum chuck. The alignment marks on the bottom mold may also be grooves that match raised structures, such as metal traces on the top layer of the chip, which can further enhance accuracy and ease of alignment. The plastic carrier can also be aligned to the chip using dowels to mate the plastic carrier and the bottom master mold in a very precise location (e.g., to within about 1.5 μm, within about 3 μm, within about 5 μm, within about 10 μm or within about 30 μm). The chip and the plastic carrier can then be integrated as described herein. The embedded features on the chip can now be referenced to features on the plastic carrier via the same pin dowel alignment used to align the mold and the carrier. Using these features, one can align subsequent structures within about 1.5 μm to about 30 μm repeatability. For example, the use of a Jergens DexLoc™ Locator Pin have a repeatability of 13 μm. This feature can be useful for alignment of microfluidic components and electrodes to the chip(s).

Figure 8:
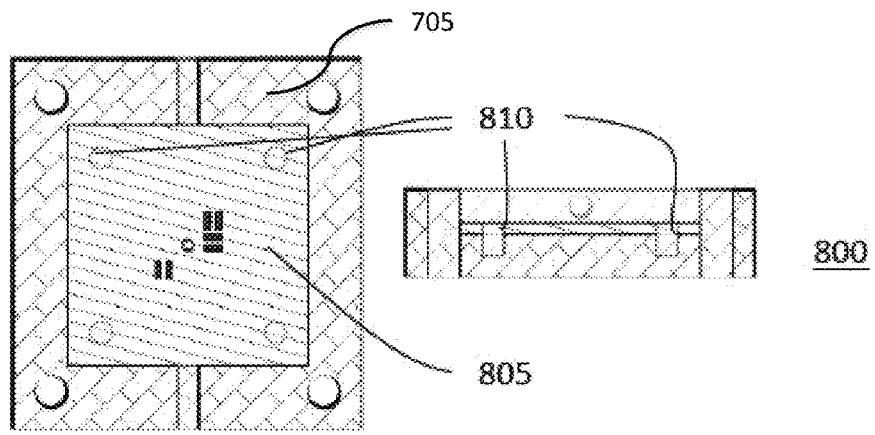
FIG. 8 shows an example of an integrated dowel-pin.
Figure 8:
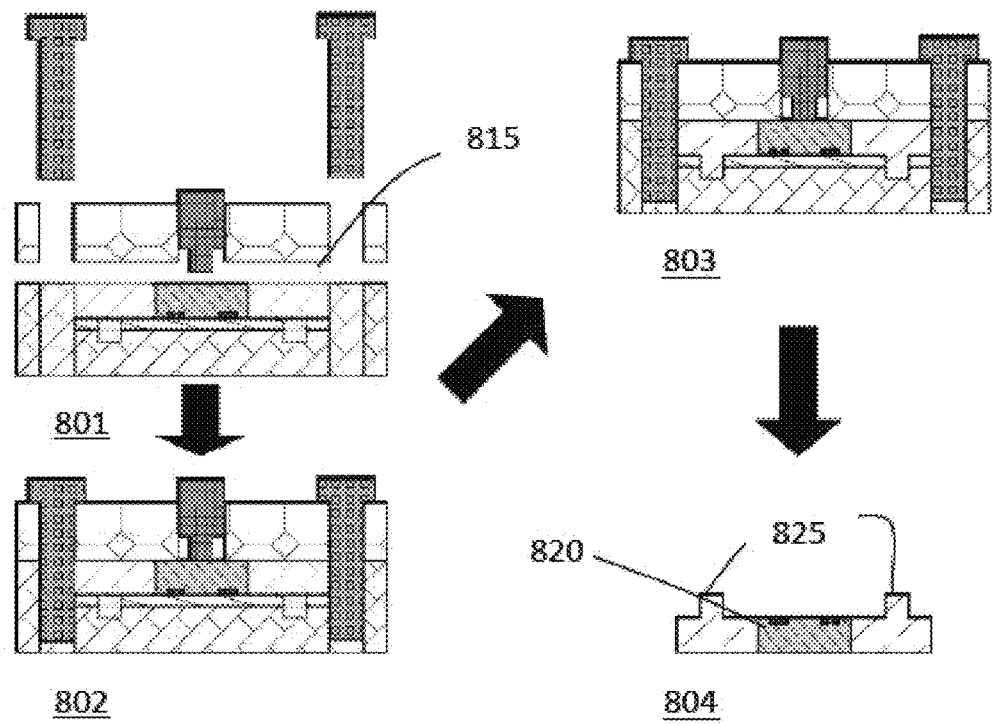

Also provided herein is a method for integration of the chip with fluidics that uses injection molding. In some embodiments, dowels-pins can be directly integrated into the plastic carrier. This can allow for subsequent features to be built on the integrated structures. These devices and methods are shown in FIG. 8. In a first view 800, which shows a left-most panel depicting a top view and a right-most panel depicting a cross-sectional view, the planarizing injection mold for low-cost alignment 805 adds additional features to the planarizing surface 705 described herein and in respect of the process described in FIG. 5, but rather than have dowel holes 715 that implement external dowel-pins 740, the mold contains dowel-pin features 810 that will create dowel-pins in the carrier during the injection molding process. An exploded cross-sectional view 801 of the low-cost alignment system with integrated pins 820 within the planarizing injection mold has components that are similar to those shown and described previously in FIGS. 7a and 7b.

The cross-sectional assembled view of low-cost alignment system 802 shows integrated pins within the planarizing injection mold 805. As previously described and shown in FIG. 5, the screws 425 and top plate 515 complete the injection mold for the carrier and the spring plunger or set screw 420 apply pressure to the chip 720 against the injection planarizing surface 805 to create a sealed system. Plastic is injection molded into system 803 to create a carrier with integrated dowel-pins around the chip 720. The system is disassembled 804 to release the CiC with integrated dowel-pins. The integrated dowel-pins 820 can be used to align the chip 720, because of their known relative position and orientation.

It should be noted that a pre-fabricated carrier with integrated dowel pins 825 can also be used to accomplish a similar result as shown in FIG. 8, but the carrier itself can lock into the planarizing surface for low-cost alignment without the need for external dowel-pins. In an embodiment of this invention, this process has a demonstrated repeatability of about 5, about 8, about 10, about 15, about 20, about 25, or about 30 microns ($\mu$m).

Fluidic Integration

As detailed above, and in one aspect, a method for packaging a chip is disclosed herein. The method involves placing a chip on a planarizing surface, and placing a carrier on the planarizing surface surrounding the chip with a gap between the carrier and the chip. The method may further involve closing the gap to bond the chip, thereby producing a chip-in-carrier (CiC). The method further involves attaching a fluidic cap to the carrier in the chip-in-carrier (CiC). The fluidic cap may be aligned to the CiC with an accuracy of about 10 to about 100 $\mu$m. The fluidic cap may include a dowel, the CiC may include a hole, such that the dowel is fit into the hole to align the fluidic cap with the CiC. The fluidic cap may include a hole, the CiC may include a dowel, such that the dowel is fit into the hole to align the fluidic cap with the CiC. The fluidic cap may include a first hole, the CiC may include a second hole, such that the dowel is fit into the first hole and the second hole to align the fluidic cap with the CiC. The fluidic cap may include a microfluidic flow channel, a mixer or a droplet generator. The fluidic cap may be plastic, and the fluidic cap may be attached to the CiC by an adhesive. Optionally, the fluidic cap may be attached to the CiC by heating the fluidic cap or the CiC to a temperature that is greater than or equal to a glass transition temperature (Tg) of a material from which the carrier or the CiC is comprised. The fluidic cap may be attached to the CiC by contacting the carrier or CiC with a solvent such that the carrier or CiC at least partially dissolves, and evaporating the solvent. Optionally, the fluidic cap may be aligned with the CiC with fiducial marks. The fluidic cap may be aligned with the CiC to an accuracy of less than about 10 $\mu$m.

Further, as detailed above, a packaged chip is disclosed herein. The packaged chip includes a chip having a first surface, and a carrier having a second surface, wherein the carrier surrounds the chip and is bonded to the chip, such that the first surface is substantially planar with the second surface. The packaged chip includes global alignment features on the carrier which are aligned to the chip. The packaged chip disclosed herein may further include a fluidic cap attached to the carrier and aligned to the global alignment features. The fluidic cap may be aligned to the carrier with an accuracy of about 10 to 100 $\mu$m. The fluidic cap may include a dowel, and the carrier may include a hole such that the dowel is fit into the hole to align the fluidic cap to the carrier. The fluidic cap may include a hole, and the carrier may include a dowel, such that the dowel is fit into the hole to align the fluidic cap to the carrier. The fluidic cap may include a first hole, and the carrier may include a second hole, such that a dowel is fit into the first hole and the second hole to align the fluidic cap to the carrier. Further, the packaged chip may include a first fiducial mark on the fluidic cap that is aligned to a second fiducial mark on the carrier or the chip. The fluidic cap may be aligned to the carrier with an accuracy of less than about 10 $\mu$m. The fluidic cap may include a microfluidic channel, a mixer, or a droplet generator. The fluidic cap may be plastic. The fluidic cap may be attached to the carrier by an adhesive. The fluidic cap may be attached to the carrier by at least partially melting or dissolving the fluidic cap or the carrier.

As used herein, "fluidic integration" or "integration" generally refers to the integration of a (micro)fluidic cap with the chip-in-carrier (CiC). Integration can be achieved by aligning the fluidic cap to the CiC and then bonding the fluidic cap to the CiC to create a sealed microfluidic and chip integrated system. Electrodes can be deposited as described herein. The fluidic cap can have any combination of various types of microfluidic components (e.g., flow channels, mixers, or droplet generators) and can be machined or injection molded. The material for the cap can be similar or the same as the carrier. The type of material can be determined by the application, and is a plastic in some embodiments.

Alignment of the fluidic cap to the CiC can be a key feature for achieving a low-cost and robust device. The alignment can be achieved by using the dowel-holes in the fluidic cap for external pin-hole alignment (as shown and described in relation to FIG. 9) or the integrated dowel pins or holes (as detailed herein) in the fluidic cap. As described herein, these features can be matched with the dowel-pin or dowel-holes in the CiC 750 or 815 to align the two components.

Bonding of the fluidic cap and CiC can be achieved via thermal, solvent, solvent-assisted thermal or adhesive bonding. For most applications, materials including but not limited to PMMA, HDPE, or COC can be used, and solvent or solvent-assisted thermal bonding can allow for fast and low cost bonding while maintaining surface modification properties of the fluidic cap (e.g., solvent vapor bonding of COC using cyclohexane). Thermal or optical curing adhesives applied to the fluidic cap using a transfer method or spray coating can also be used, as they allow for large area integration without compromising the properties of the channel surface. In either case, the CiC can be treated with vacuum plasma, atmospheric plasma or UV/ozone to enhance bonding strength between the chip and plastic in subsequent steps. In some embodiments, an adhesion promoter such as hexamethyldisilazane (HMDS) can be used to enhance bonding. In some cases, non-chemical modifications are preferred as they are simple and easily scalable. Several examples and methods utilizing the alignment methods of the present disclosure are described below.

Figure 9:
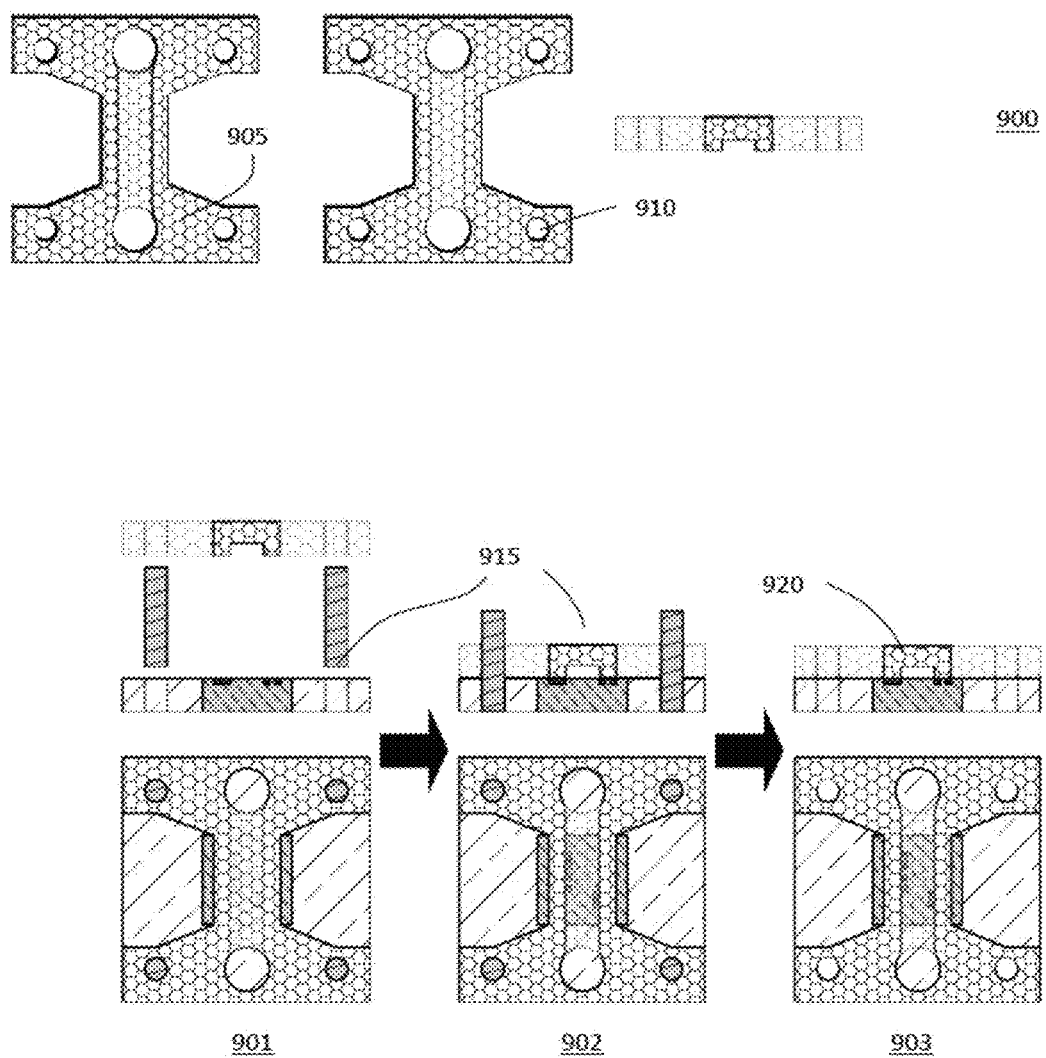
FIG. 9 shows an example of fluidic integration using an external pin-hole.

FIG. 9 shows the integration of a simple flow-channel fluidic cap using external pin-holes for alignment, building on the features previously described and shown in relation to FIG. 7. As shown in the first view 900 of FIG. 9, which shows a left-most panel depicting a bottom view, a middle panel depicting a top view, and a right-most panel depicting a cross-sectional view, shows a flow channel fluidic cap for external pin-hole alignment 905 can have dowel-holes 910 as part of the fluidic cap. The exploded or unassembled view 901 of the external alignment process is shown. The dowel-pins facilitate alignment between the fluidic cap 905 and the CiC with external dowel-holes 750. The assembled 902 external dowel pin-hole fluidic integration system 915 is shown. Surface preparation and modification can be performed prior to assembly. For example, the surface of the fluidic cap can be exposed to solvent vapor directly before assembly. After bonding is complete 903, dowels can be removed to release the device with external alignment 920 being performed. For reference, the top panels in views 901, 902, and 903 are cross-section views; whereas, the bottom panels in views 901, 902, and 903 are top views.

Figure 10:
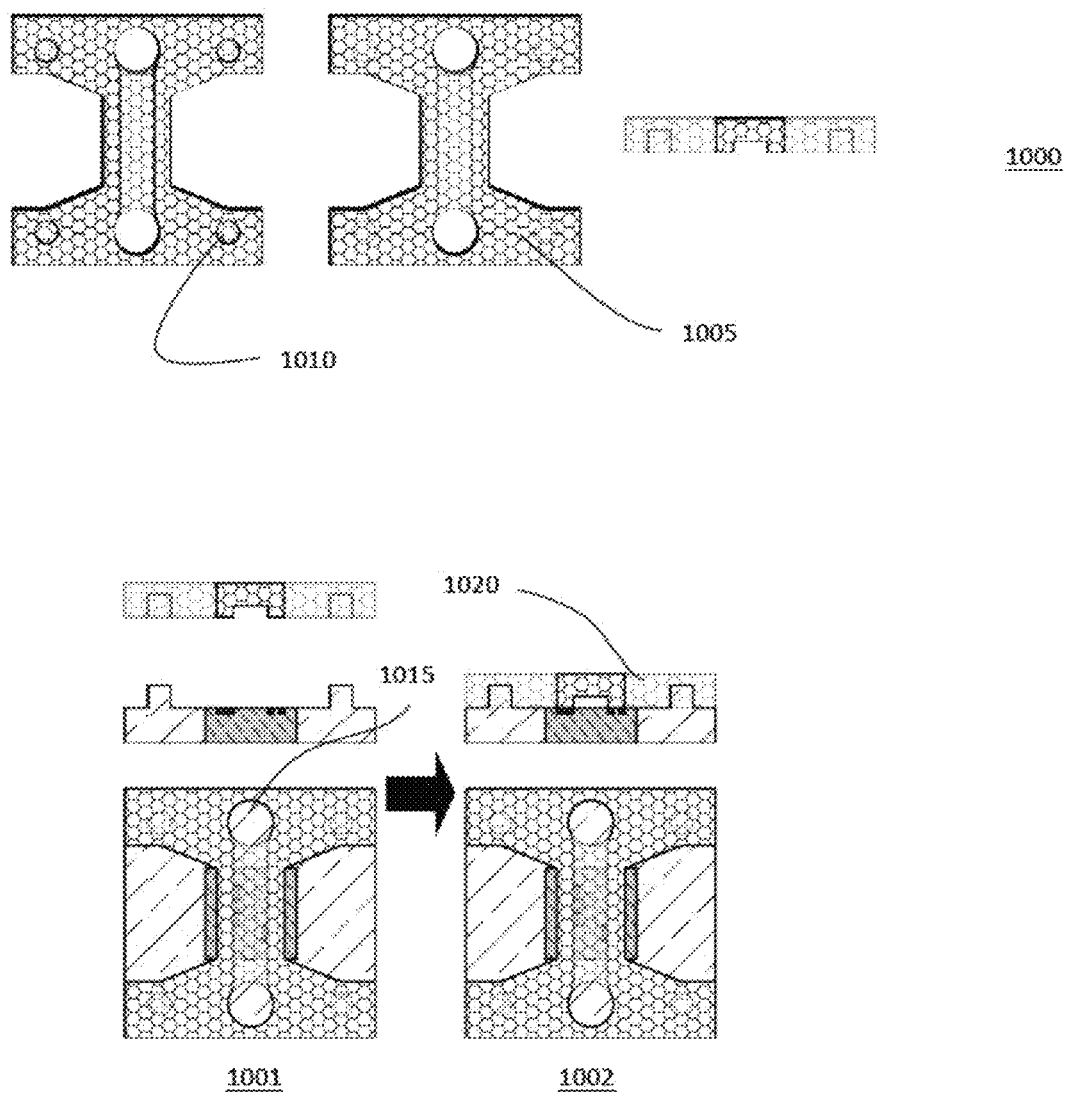
FIG. 10 shows an example of fluidic integration using an integrated dowel and pin-hole.

FIG. 10 shows the integration of a flow-channel fluidic cap using integrated pin-holes for alignment, with features similar to those shown and discussed with reference to FIG. 8. As shown in the first view 1000 of FIG. 10, which shows a left-most panel depicting a bottom view, a middle panel depicting a top view, and a right-most panel depicting a cross-sectional view, a flow channel fluidic cap having integrated pin-holes 1005 has dowel-holes 1010 as part of the fluidic cap. The exploded or unassembled view 1001 of the integrated pin-hole fluidic alignment system 1015 is shown. In some embodiments, no further components are required other than the integrated pin 820 in the CiC 815 and the integrated holes 1010 in the fluidic cap 1005. The assembled integrated pin-hole fluidic alignment system 1015 is shown at 1002. Surface preparation and modification can be completed prior to assembly. For example, the surface of fluidic cap can be exposed to solvent vapor directly before assembly. After the bonding is complete the device with integrated alignment 1020 can be released. For reference, the top panels in views 1001 and 1002 are cross-section views; whereas, the bottom panels in views 1001 and 1002 are top views.

Figure 11:
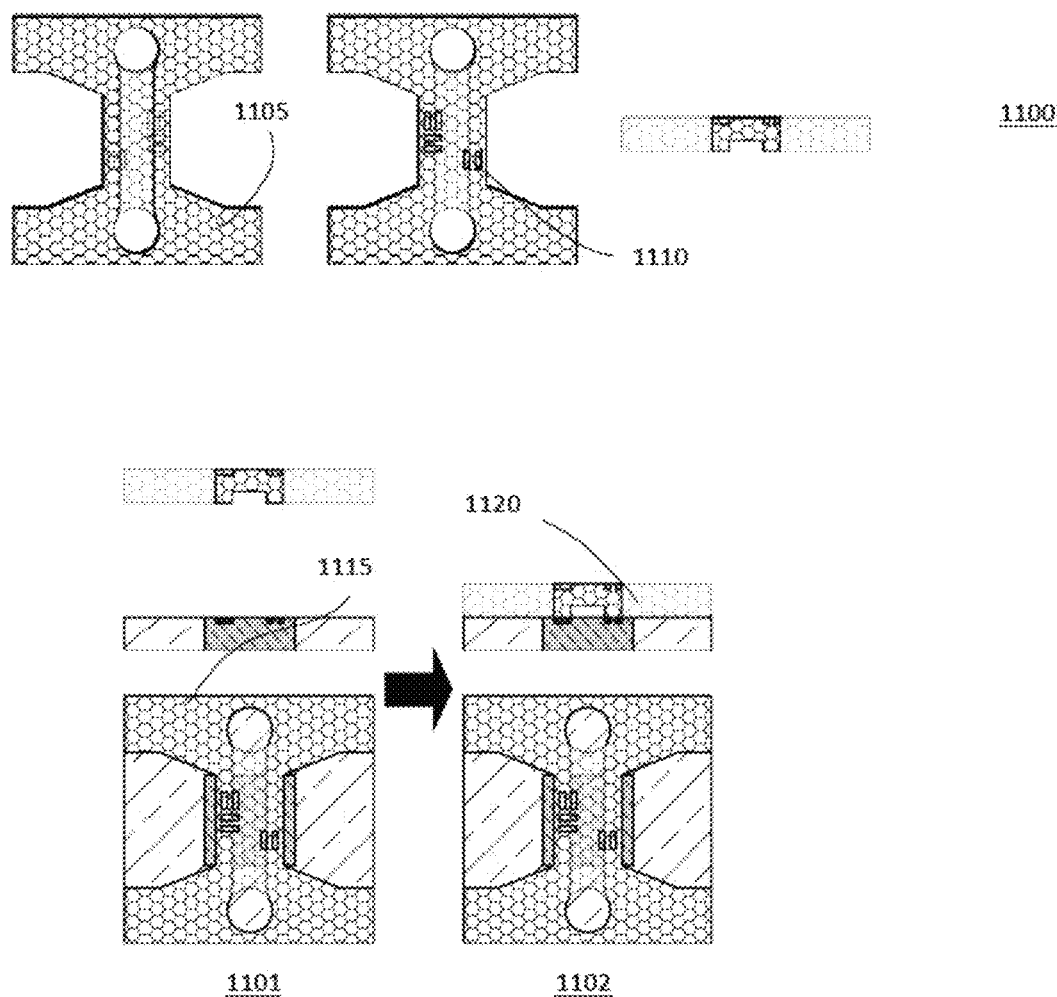
FIG. 11 shows an example of precision alignment of fluidics.

For high precision alignment (e.g., less than about 10 µm, less than about 8 µm, less than about 5 µm, less than about 3 µm, or less than about 1 µm (micron) accuracy) alignment fiducials can be integrated into the fluidic cap, which correspond to fiducials on the surface of the chip. A fiducial, also referred to as a fiducial marker is an object placed in the field of view of an imaging system which can facilitate measurement or alignment. The pin-hole methods described herein can be used for rough alignment, in order to achieve high precision alignment using the fiducials more rapidly. In some cases, the cap and CiC can be aligned using a pick-and-place tool as contemplated in FIG. 11.

As shown at 1100, which shows a left-most panel depicting a bottom view, a middle panel depicting a top view, and a right-most panel depicting a cross-sectional view, a fluidic cap for precision alignment 1105 can have fiducials on the cap 1110, which correspond to fiducials on the chip 725 (as has previously been described in FIG. 7a). An exploded cross-sectional view of the fluidic precision alignment system 1115 is shown at 1101. Alignment can be performed directly between the fluidic cap and chip. The assembled fluidic alignment system 1115 is shown at 1102. For reference, the top panels in views 1101 and 1102 are cross-section views; whereas, the bottom panels in views 1101 and 1102 are top views. Surface preparation and modification can be performed prior to assembly. For example, the surface of the fluidic cap can be directly exposed to solvent vapor before assembly. After the bonding is complete the device with precision alignment 1120 can be released.

Electrode Deposition

As detailed above, and in one aspect, a method for packaging a chip is disclosed herein. The method involves placing a chip on a planarizing surface, and placing a carrier on the planarizing surface surrounding the chip with a gap between the carrier and the chip. The method further involves closing the gap to bond the chip, thereby producing a chip-in-carrier (CiC). The method may further involve depositing an electrode on the CiC that can electrically address the chip. The method may involve aligning a shadow mask to the CiC wherein the electrode is deposited through the shadow mask. The electrode may be deposited on the CiC using screen printing or vacuum deposition. The shadow mask may be aligned to the CiC with an accuracy of about 10 to about 100 µm. The shadow mask may include a dowel, the CiC may include a hole, such that the dowel is fit into the hole to align the shadow mask with the CiC. The shadow mask may include a hole, the CiC may include a dowel, such that the dowel is fit into the hole to align the shadow mask with the CiC. The shadow mask may include a first hole, the CiC may include a second hole, such that the dowel is fit into the first hole and the second hole to align the shadow mask with the CiC. The method may further involve aligning the shadow mask with the CiC with fiducial marks. The shadow mask may be aligned with the CiC to an accuracy of less than about 30 µm. The method may further involve injecting a solution into the fluidic cap to deposit an electrode on the CiC that can electrically address the chip. The fluidic cap may include vent ports, and the solution may include an electrically conducting material and the solution may be evaporated or solidified to deposit the electrode. The fluidic cap may be attached to the CiC on a first surface and the electrode addresses the chip on a surface side of the CiC. The electrode may be in electrical communication with a contact pad on the chip.

Further, the packaged chip detailed herein may further include an electrode aligned to the global alignment features and in electrical contact with the chip. The electrode may not be wire bonded to the chip. The electrode may be deposited or printed onto the carrier. The electrode may be deposited or printed onto the carrier through a shadow mask that is aligned to the carrier with an accuracy of about 10 to 100 µm. The shadow mask may include a dowel, and the carrier may include a hole, such that the dowel is fit into the hole to align the shadow mask to the carrier. The shadow mask may include a hole, and the carrier may include a dowel, such that the dowel is fit into the hole to align the shadow mask to the carrier. The shadow mask may include a first hole, and the carrier may include a second hole, such that a dowel is fit into the first hole and the second hole to align the shadow mask to the carrier. The packaged chip detailed herein may further include a first fiducial mark on the shadow mask that is aligned to a second fiducial mark on the carrier or the chip. The shadow mask may be aligned to the carrier with an accuracy of less than about 10 µm. Optionally, the electrode may be deposited in a channel of the fluidic cap described herein. The fluidic cap may include a vent port that is in fluid communication with the channel. The fluidic cap may be bonded to the carrier on a first side while the electrode is in electrical contact with the chip on a second side. The electrode may be in electrical communication with a contact pad on the chip.

Large area electrodes can be patterned on the plastic carrier and connected to the chip, e.g., in order to electronically connect the chip to external devices. The coplanar, gap-free integration of the chip and plastic carrier described herein can facilitate electrode deposition. Several methods are described herein for electrode integration on plastic. In some cases, the process described herein can be used to deposit electrochemical electrodes such as Ag/AgCl, on or near the chip.

In some cases, the electrode is created using a shadow mask and metal deposition. In some cases, traditional semiconductor methods of using photoresists in combination with a vacuum metallization cannot be used for patterning electrodes on the surface of the plastic chip. A shadow mask, which is a thin, micromachined template can be used instead. Shadow masks are commercially available and can be precisely fabricated from a number materials such as stainless steel, or sometimes more precisely in a bi-metal process. The alignment of the electrode pattern to the chip can be a critical feature of the shadow mask system. The shadow mask can be aligned using alignment marks on the chip or carrier. In some cases, the shadow mask is aligned using a pin-based alignment method using the integrated or external pins in the CiC coupled with dowel holes on the shadow mask that line up with the pins. After alignment, the electrodes can be deposited through the shadow mask and onto the chip and carrier using vacuum deposition.

Figure 12:
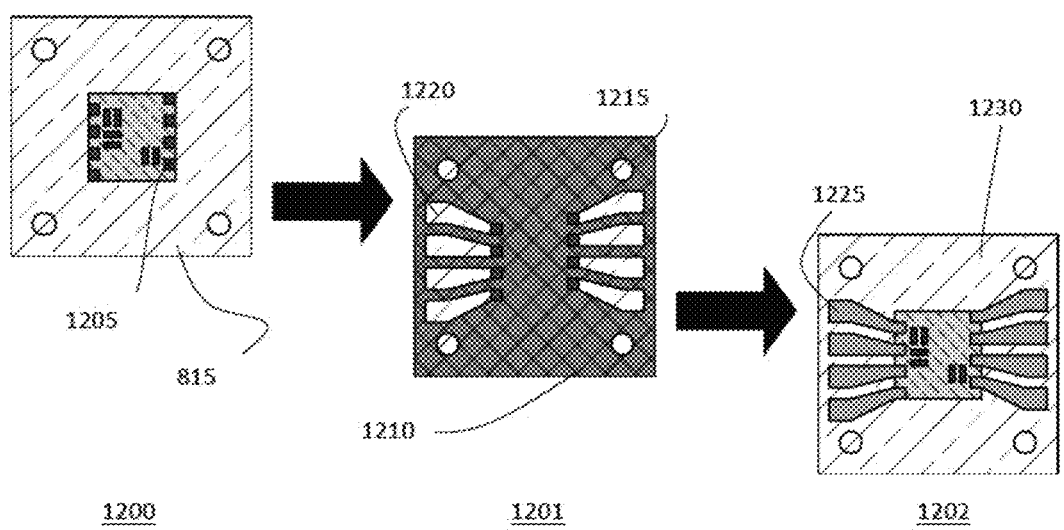
FIG. 12 shows an example of integrated external dowel and pin-hole alignment for electrodes.

The alignment with a CiC using integrated pins is shown in FIG. 12. The process begins at 1200 with a CiC having integrated pins 815. The chip typically has contact pads 1205 that may require an electrical connection. Next at 1201, a shadow mask 1210 can be aligned to the chip by means of the alignment between the holes on the shadow mask 1215 and the pins on the CiC 815. The shadow mask can have openings for the large electrodes that align with the contact pads 1220. Finally, at 1202, metal can be vacuum deposited and the electrode pattern from the shadow mask 1220 can be transferred to the CiC 1225. The shadow mask can be removed to finalize the CiC with integrated pins and patterned large area electrodes 1230. For reference, the views shown at 1200, 1201, and 1202 are all top views.

Figure 13:
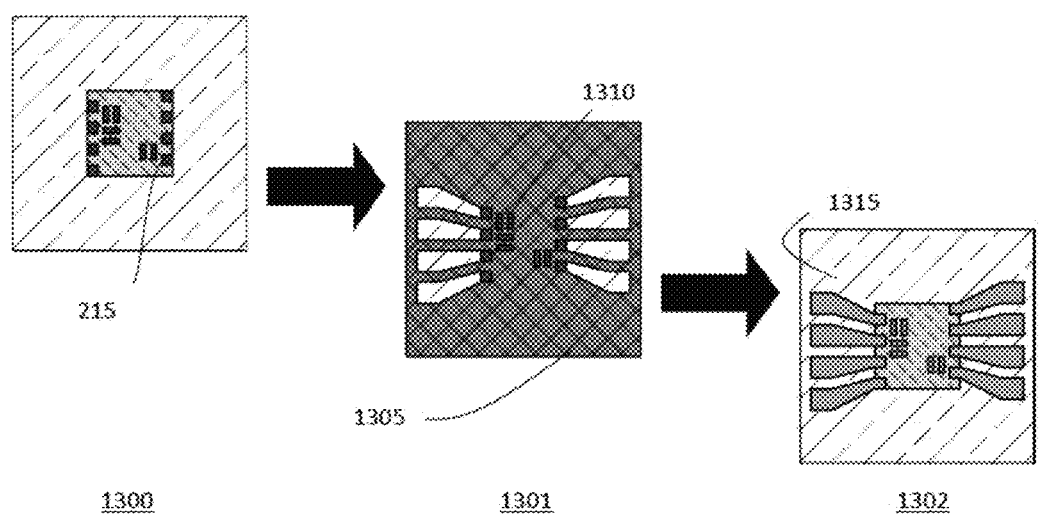
FIG. 13 shows an example of precision alignment of electrodes.

FIG. 13 shows an example of precision alignment of the fluidic cap to the chip. The process begins at 1300 with the CiC 215. Next, at 1301, a shadow mask 1310 can be aligned to the chip by means of fiducials on the shadow mask, which align to fiducials on the chip. Finally, at 1302, metal can be vacuum deposited and the electrode pattern from the shadow mask 1310 can be transferred to the CiC 215. The shadow mask can be removed to finalize the CiC with precisely aligned large area electrodes 1315. For reference, the views shown at 1300, 1301, and 1302 are all top views.

In some cases, the electrode is created using screen printing. The process is similar to the shadow mask method, but instead of using a vacuum deposition process, the electrodes are screen printed on the surface. Pin-hole alignment can be used to keep the chips in place during processing. A number of screen printing metals (e.g., copper or silver) or carbon pastes can be used for this process.

In some cases, the electrode is created using injection molding. An aspect of the present disclosure is the addition of channels as part of the fluidic cap to allow for injection molding of a conducting epoxy (e.g., a conducting copper or a conducting silver paste). These channels can be filled with a conducting paint or epoxy to create electronically conducting leads. This method can be used with any of the fluidic integration or alignment methods described herein.

Figure 14A:
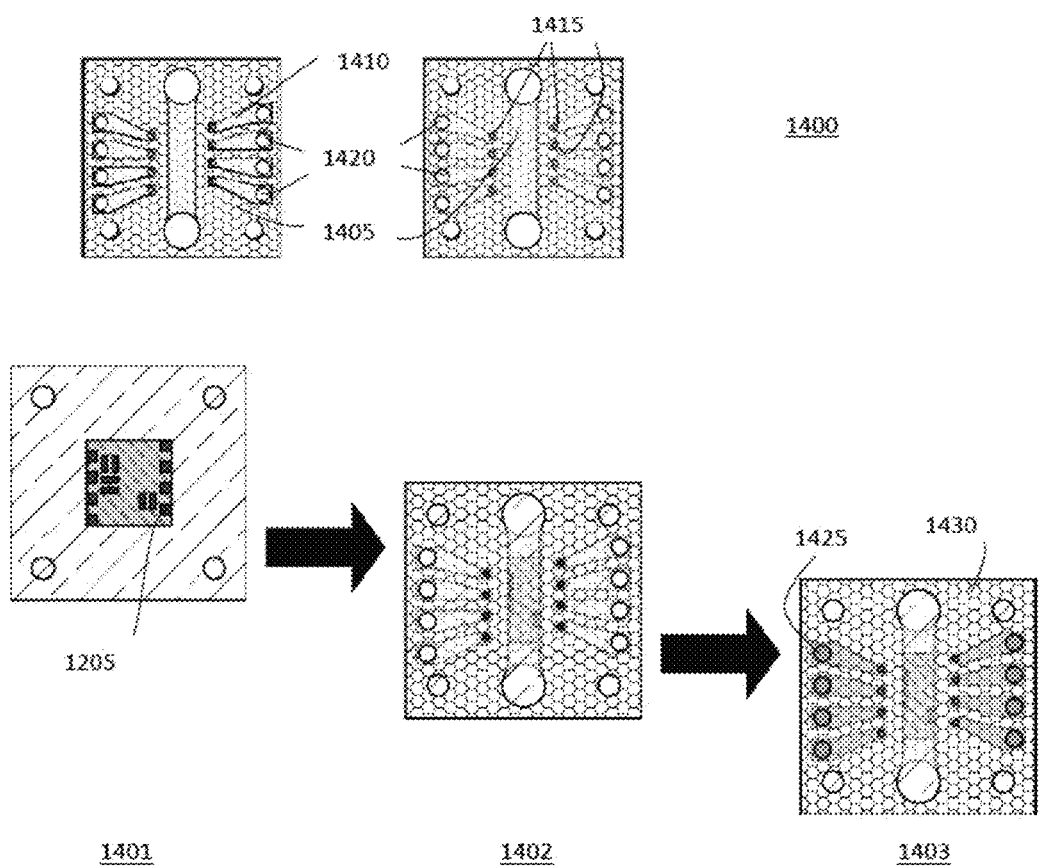
FIG. 14a and FIG. 14b show an example of injection molding of top electrodes.
Figure 14B:
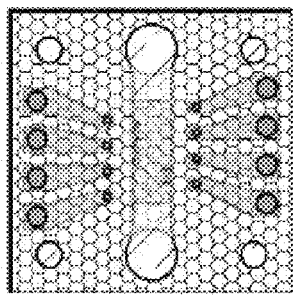
Figure 14B:
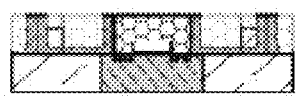
Figure 14B:
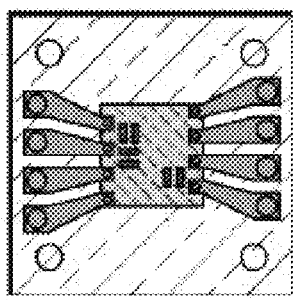
Figure 14B:
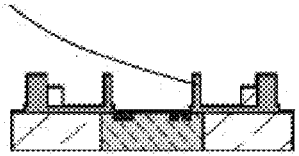

An example of the process using a CiC with integrated pins is shown in FIG. 14a and FIG. 14b. The process is enabled by a flow-through fluidic cap summarized at 1400 (having a left-most panel depicting a bottom view of the fluidic cap and a right-most panel depicting a top view of the fluidic cap) with integrated electrode injection ports 1405, which optionally have a vent holes. Features include the injection ports that double as areas for making large area electrical contact pads 1420, the electrode channel 1410, and the vent ports to facilitate the injection 1415. The process begins at 1401 with a CiC with integrated pins 820 (as previously described herein). The chip typically has contact pads 1205 that require a chip-to-world electrode contact pad. The next step in the process 1402 is to bond the fluidic cap 1405 to the CiC 820 using any of the processes described herein. Next, at 1403, metal can be injected 1425 into the ports to create the device with injected electrodes 1430. FIG. 14b shows top view (left-most panels) and cross-sectional images (right-most panels) 1404 of the final structure 1430. A view without the cap 1405 is show to highlight how the contacts looks after injection and solidification of the metal electrodes 1435.

Figure 15A:
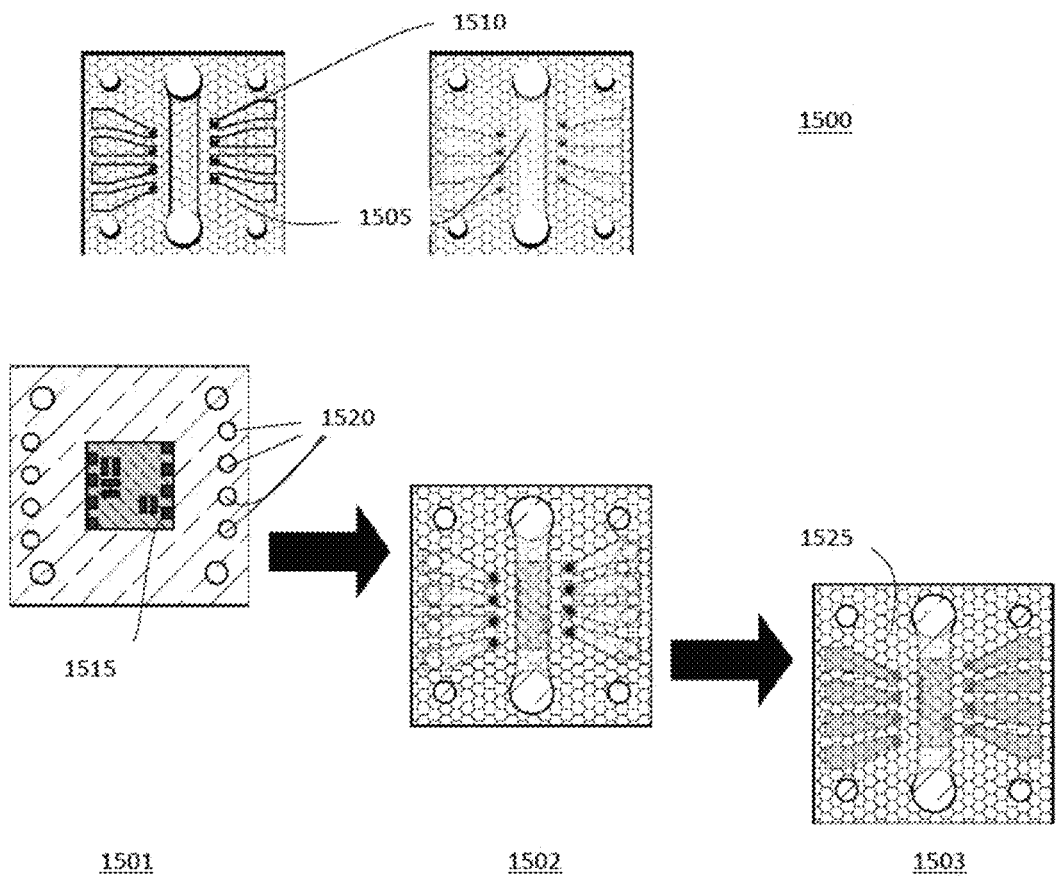
FIG. 15a and FIG. 15b show an example of injection molding of bottom electrodes.
Figure 15B:
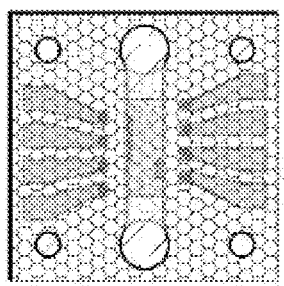
Figure 15B:
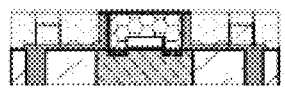

The injection molding method described herein enables 3-dimensional (3D) interconnects, such as those shown in FIG. 15a and FIG. 15b where the contacts are routed to the bottom side of the CiC. In some cases, the fluidic cap for bottom injected electrodes summarized at 1500 (having a left-most panel depicting a bottom view and a right-most panel depicting a top view) does not have ports for electrode injection or contacting. The cap only contains the vent ports in some instances, which is in contrast to the fluidic cap shown in FIG. 14a and FIG. 14b. As shown at 1501, the ports for injection and/or electrical contact are on the CiC. In this case, the CiC 1515 has both integrated pins and ports for bottom injection 1520. The next step 1502 is to bond the fluidic cap to the CiC with integrated pins and ports for bottom injection 1515, using the integrated pins for alignment of the injection channel with the ports on the bottom and the pads on the chip. Finally, at 1503, conducting material is injected in the ports to create the device with bottom electrodes 1525. A top view (left-most panel) and cross-sectional (right-most panel) image 1504 of the device shown in FIG. 15b highlight how electrode contacts on the bottom address the contact pads on top. This method can be especially useful where the area above the fluidics is used for optical excitation.

3D Fluidics

The methods disclosed herein may further involve attaching a second fluidic cap to the first fluidic cap in the chip-in-carrier (CiC). The method may further involve attaching a second fluidic cap to a second surface of the chip-in-carrier (CiC). The method may further involve a plurality of chips being surrounded by the carrier such that the CiC is comprised of a plurality of chips. The CiC may have a hole or a dowel that can be used to align the CiC with another CiC. The CiC may have a hole or a dowel that can be used to align the CiC with an apparatus capable of electrically and/or fluidically addressing the chip.

The packaged chip disclosed herein may further include a second fluidic cap attached to the first fluidic cap and aligned with the global alignment features. The second fluidic cap may be attached to the carrier on an opposite side of the carrier and aligned with the global alignment features.

In some cases, the devices and methods described herein (e.g., the pin-hole style integration) enable 3-dimensional (3D) fluidic integration. Any number of fluidic structures can be stacked to create a multilevel fluidic device (e.g., 2, 3, 4, 5, 6, 7, 8, 9, 10, or more). Fluidic structures can be aligned to the periphery of the chip-in-carrier structure. This can be advantageous in devices that require fluidic access from both sides of the chip, such as in the case of porous membrane devices, such as ion exchange membranes.

Figure 16A:
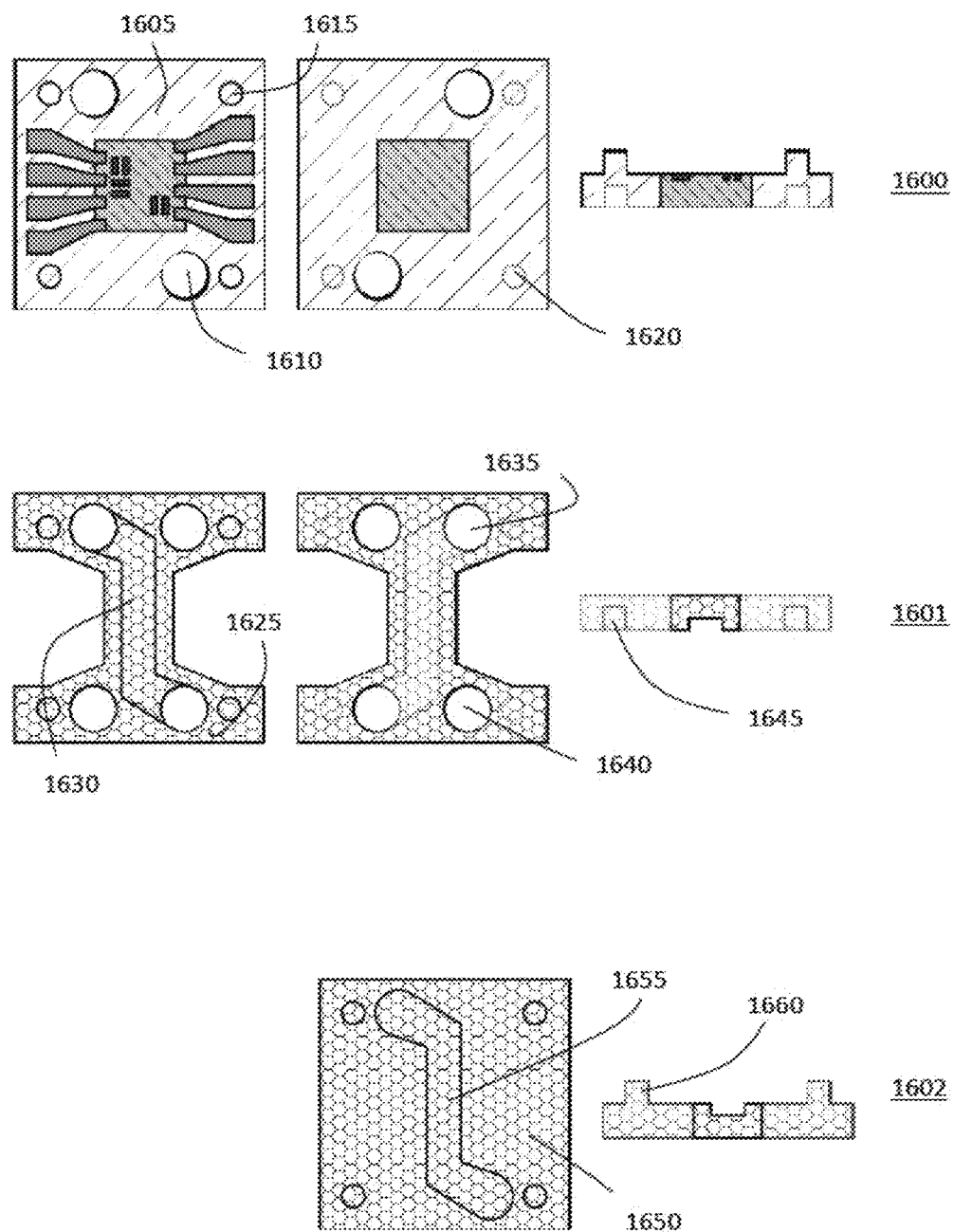
FIG. 16a and FIG. 16b show an example of 3-dimensional (3D) fluidic integration.
Figure 16B:
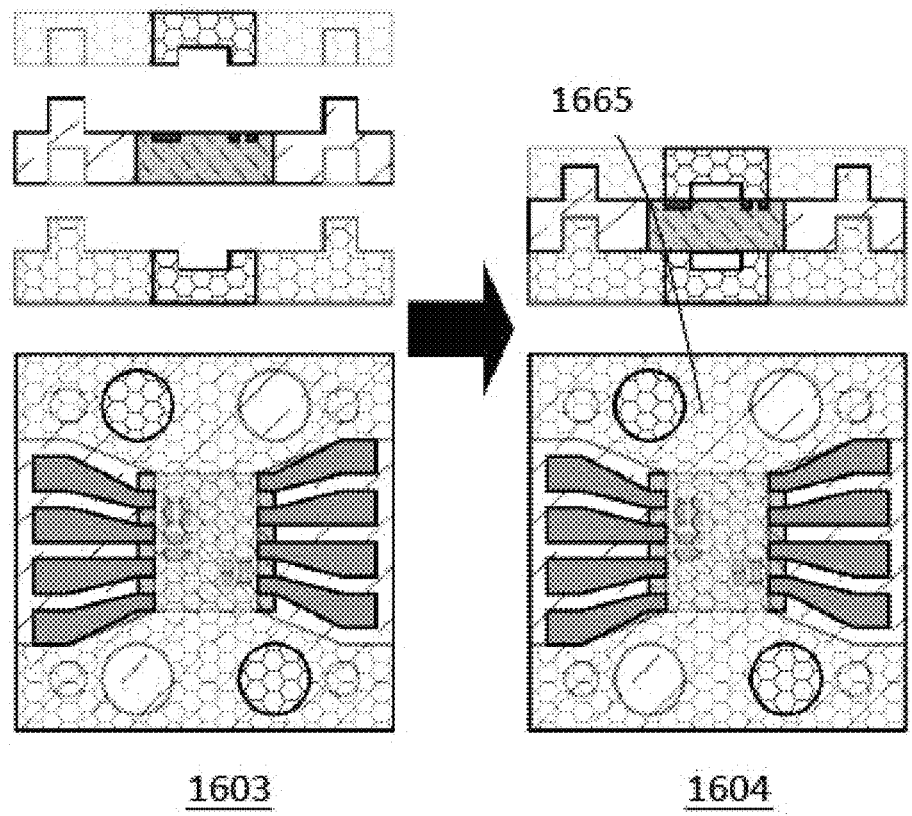

As an example, FIG. 16a and FIG. 16b show how a device can be created with top and bottom flow channels, and then aligned using a CiC with integrated pin-holes. As described herein with reference to 3D injection molded interconnects, a CiC can have ports for fluidics that facilitate liquid access to the bottom of the chip. A 3D CiC with electrodes and integrated pin-hole structures 1605 is shown in bottom (left-most panel), top (middle panel) and cross sectional (right-most panel) views is depicted at 1600. The CiC 1605 has bottom fluidic access ports 1610, as well as a top integrated pin 1615 and bottom integrated hole 1620. The top pin 1615 enables the alignment of a fluidic cap on the top side of the CiC 1605 and the bottom holes enable the alignment of a second fluidic cap to the bottom side of the CiC. In some cases, dowel through-holes can be used, e.g., in the case of alignment using an external pin.

As shown at 1601 (which shows a bottom view in the left-most panel; a top view in the middle panel; and a cross-sectional view in the right-most panel), the top fluidic cap 1625 can have a single flow channel that flows above the chip 1630, an injection port for the top channel 1635, an injection port for the bottom channel 1640, and integrated holes 1645 for alignment to the top of the CiC 1605.

As shown at 1602 (which shows a top view in the left-most panel and a cross-sectional view in the right-most panel), the bottom fluidic cap 1650 can also have a single flow channel that flows below the chip 1655. Integrated pins 1660 can facilitate alignment of the bottom fluidic cap to the bottom of the CiC 1605. The alignment of all the components are shown prior to assembly in 1603 of FIG. 16b; the final assembled device having 3D fluidics 1665 is also shown in 1604 of FIG. 16b. For reference, the upper panels are cross-sectional views; whereas, the lower panels are top views.

Integration of Multiple and/or Mixed Chips

The packaged chip detailed herein may include a plurality of chips being surrounded by the carrier. A second packaged chip may be aligned to the global alignment features on the carrier.

As described herein, the process of the present disclosure is capable of integrating multiple chips with fluidics and/or electrodes. The multiple chips can be of the same or similar design, or different design. For instance, a silicon based photodetector can be integrated with a GaAs vertical cavity surface-emitting laser (VCSEL). For example, because the two chips are co-planar, interconnects can be connected between them to create a feedback circuit. This can be accomplished by including additional alignment marks corresponding to each chip on the master mold and individually aligning each chip with the master mold as described herein. Both chips can be embedded in the CiC as described herein.

In the case of two chips ("A" and "B"), the chips can be aligned to each other via the mold, and in some cases, are globally aligned to the pin-hole structures. The plastic carrier can be pre-machined with holes closely matching the mixed chips or injection molded. The chips can be held in place using vacuum or pressure.

Figure 17A:
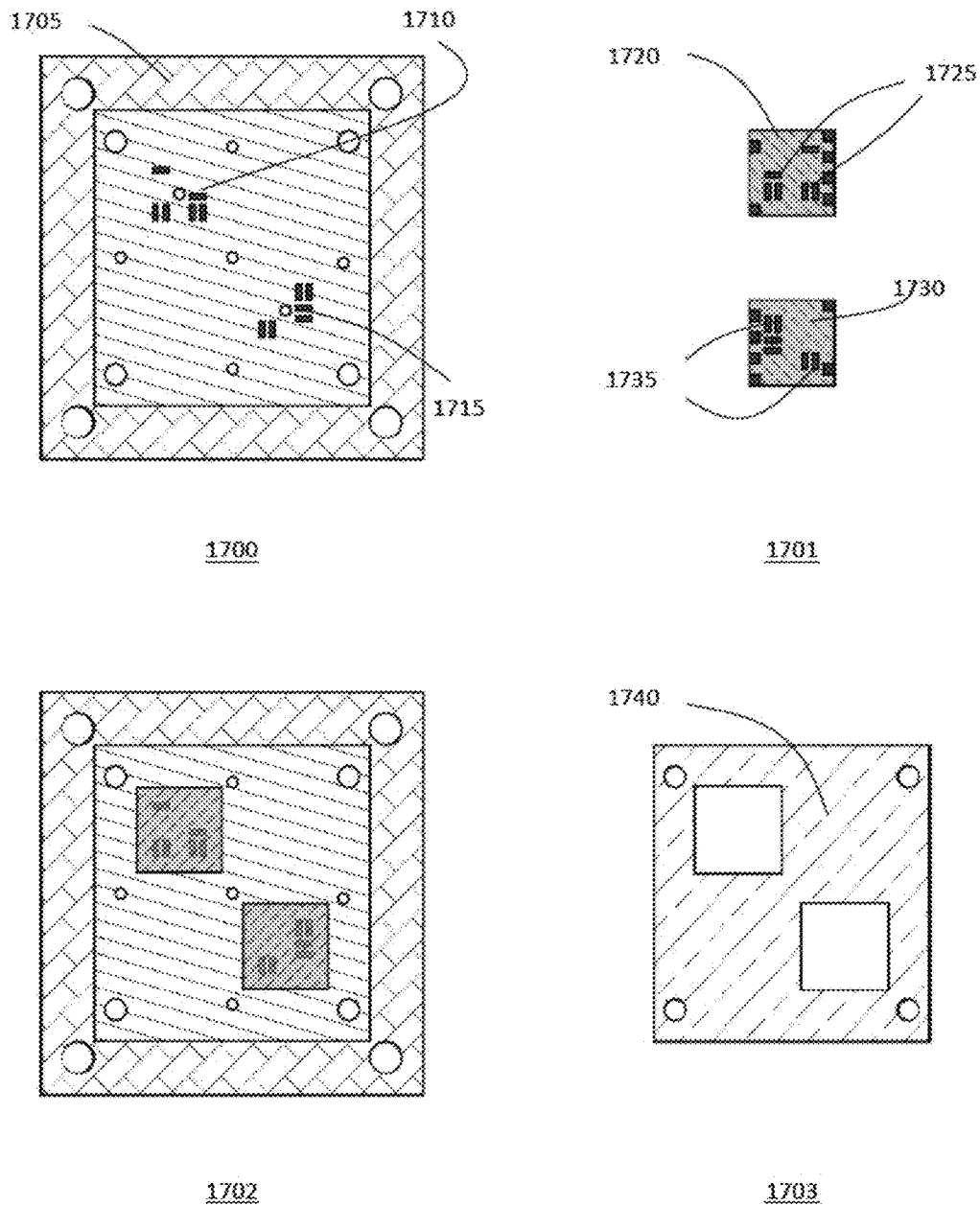
FIG. 17a, FIG. 17b and FIG. 17c show an example of multi-chip integration.
Figure 17B:
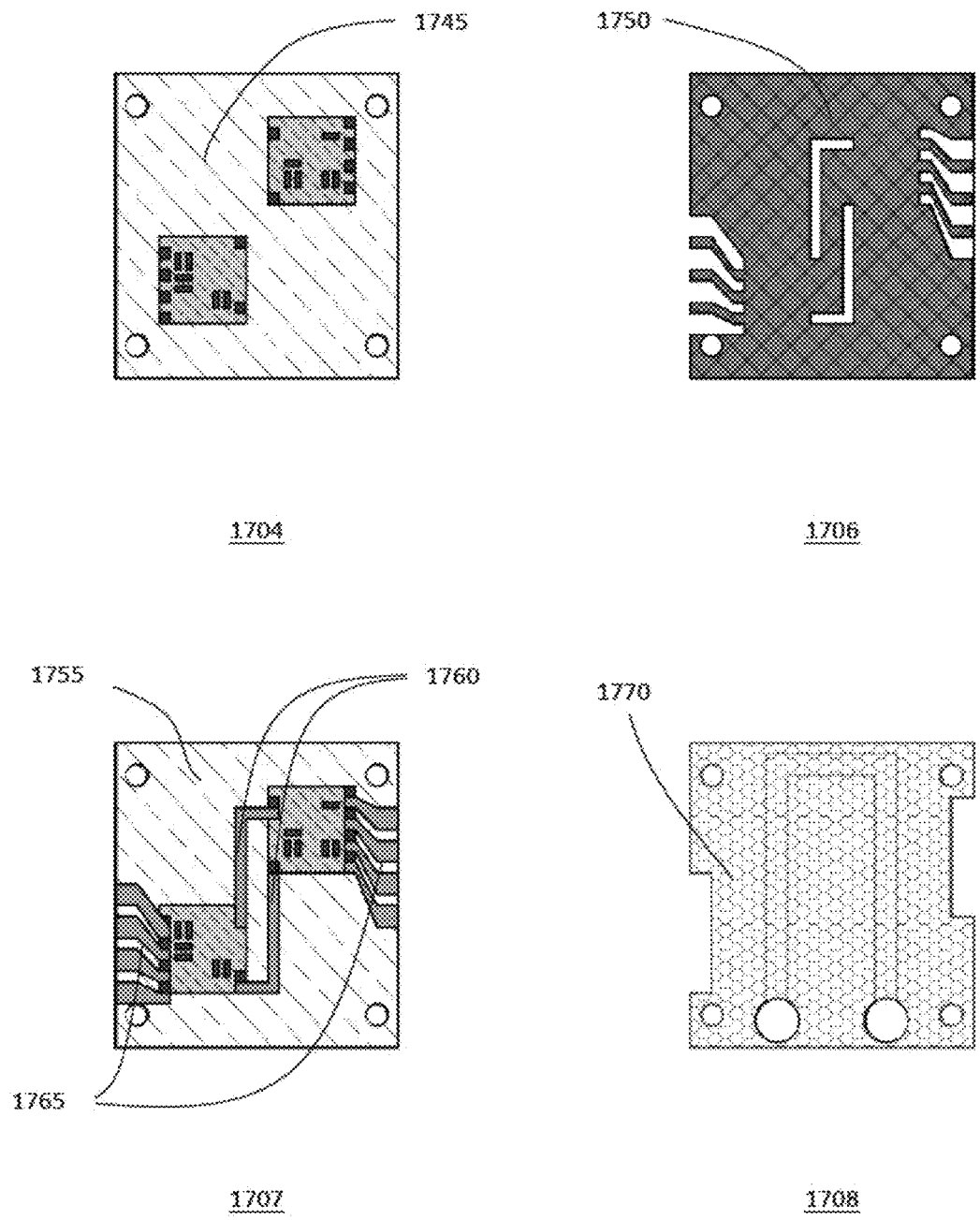
Figure 17C:
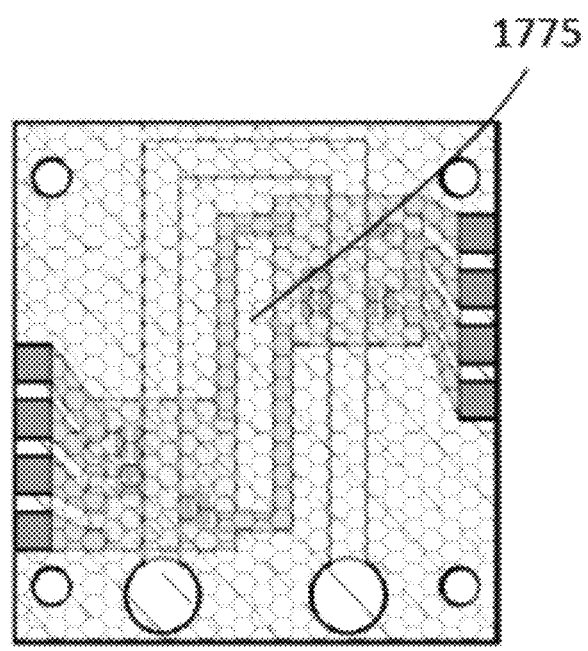

FIG. 17a, FIG. 17b, and FIG. 17c show an example of multi-chip integration. The first panel shows a mixed chip mold 1700 for two chips 1705. The mold 1700 has complimentary fiducials for Chip A 1710 and Chip B 1715. The two chips depicted at 1701 include Chip A 1720 and Chip B 1730, which can be CMOS, MEMS, or III-V, for example. They each have their own unique set of fiducials that correlate to those on the mold (i.e., Chip A fiducials 1725 and Chip B fiducials 1735).

The process begins at 1702 by picking-and-placing Chip A 1720 and B 1730 independently on the mold 1705 using the fiducials for alignment, as described herein. With reference to FIG. 17a at 1703, a multi-chip carrier 1740 can be prefabricated using any of the methods described herein.

The chips are integrated as depicted at 1704 of FIG. 17b with the plastic carrier using the methods described herein to create a multi-chip CiC 1745. The chips are now aligned to each other by virtue of the global dowel pin-holes on the mold.

An example of a shadow or silk screen mask 1750 is shown at 1706 of FIG. 17b. The mask can have electrodes that electrically connect Chip A with Chip B and create bulk chip-to-world electrodes and contact pads. As shown at 1707, the global alignment holes on the shadow mask, world-to-chip electrodes 1765 as well as inter-chip electrodes 1760 can be deposited to create a CiC with electrodes 1755. As shown at 1708, the final component is a fluidic cap 1770, which has a flow channel that flows liquid over Chip A and Chip B for example. As shown at 1709 of FIG. 17c, the fluidic cap 1770 (from FIG. 17b) and CiC with electrodes can be integrated as described herein to create a device having a plurality of chips 1775.

Large Area Integration

As detailed herein large area integration can further reduce the cost of the process by enabling multiple devices to be produced in parallel. The master mold can accommodate a plurality of the same chip or a combination of chips, which are all globally aligned as they would be on a wafer. This essentially allows parallelization of any of the processes described herein.

Figure 18A:
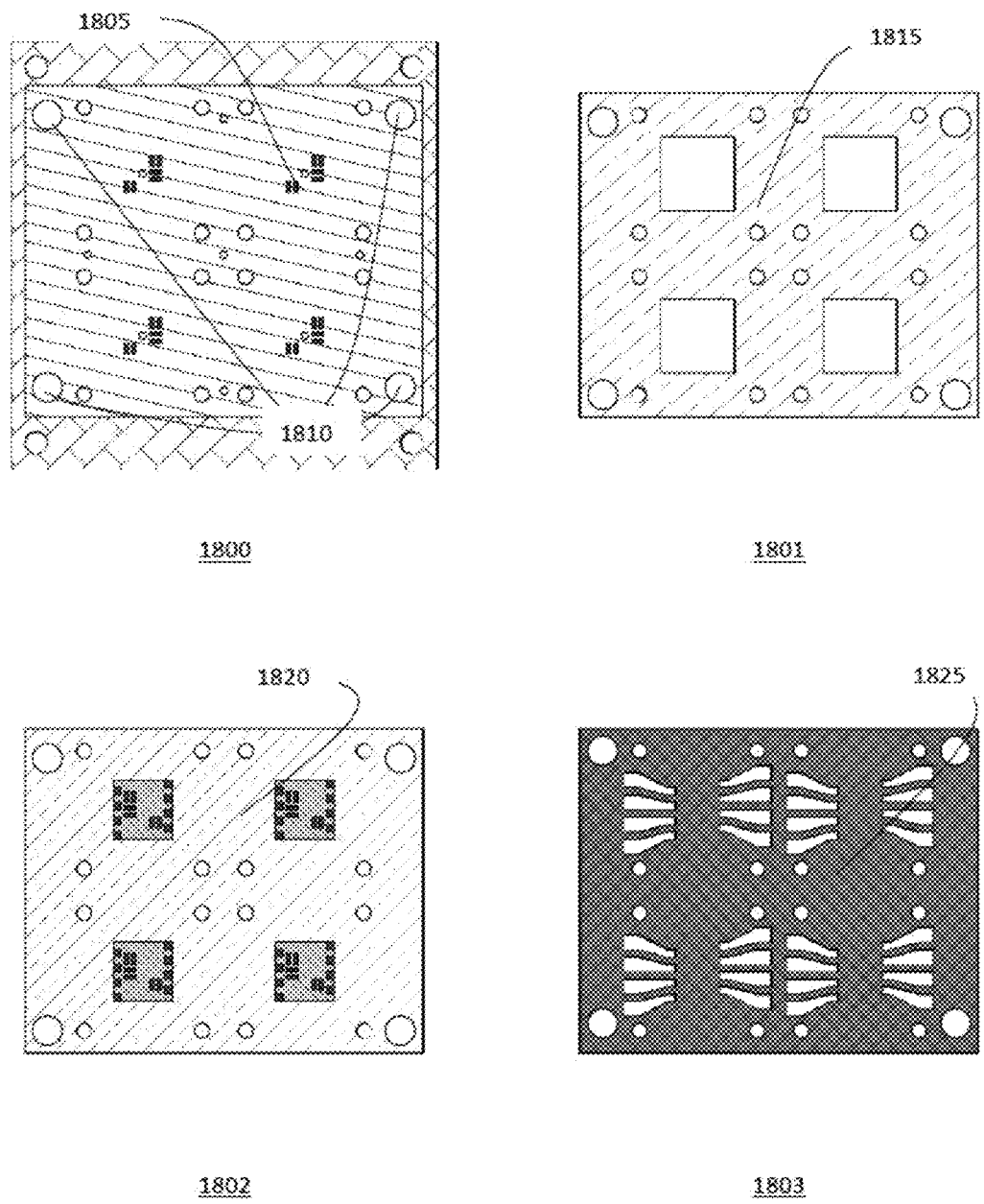
FIG. 18a and FIG. 18b show an example of large area integration.
Figure 18B:
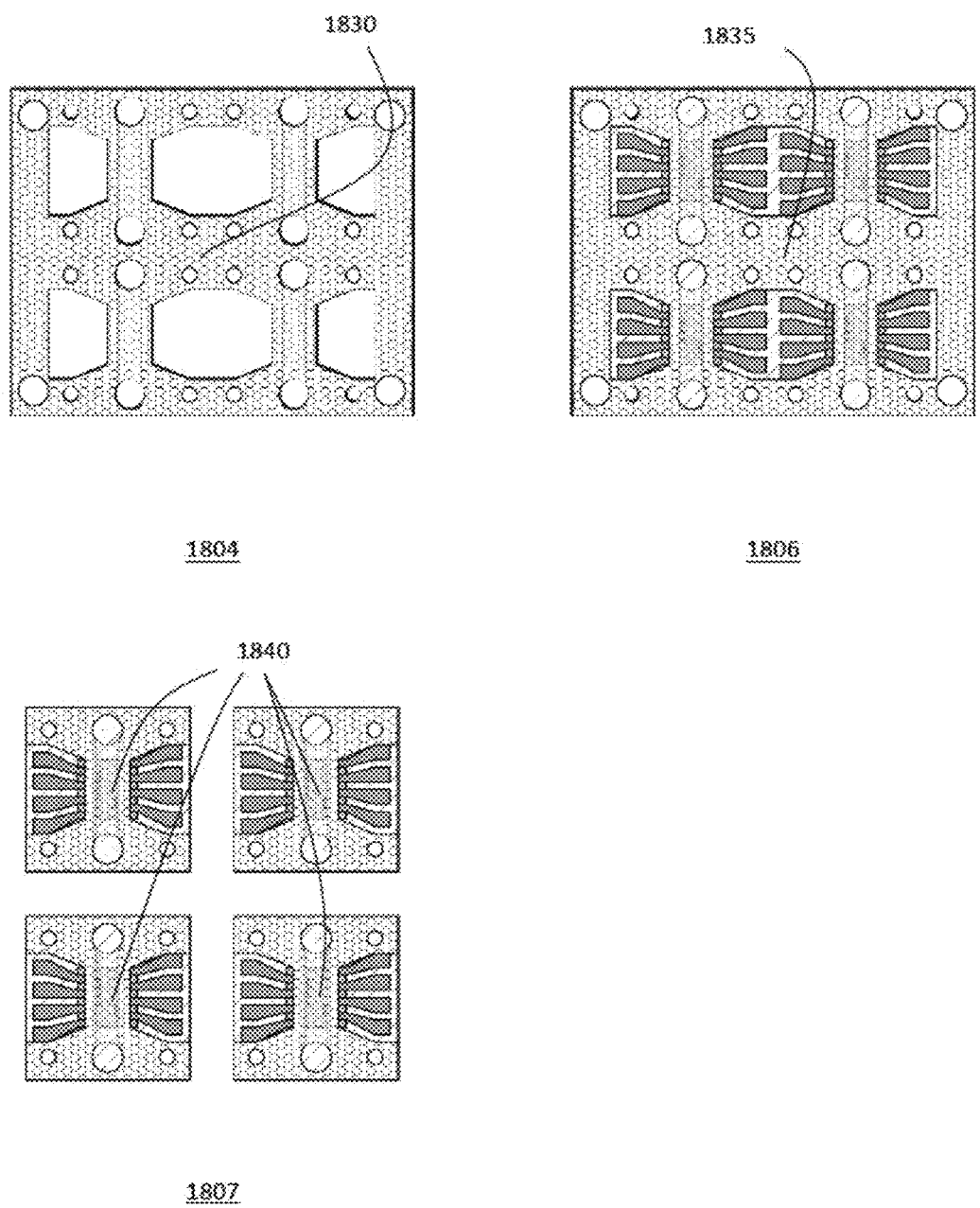

FIG. 18a and FIG. 18b show an example of a parallelized packaging of four chips. A mold capable of parallelizing a 2×2 array chips 1805 is shown at 1800. Placement and alignment of the chips on the mold can be performed serially, but all subsequent steps are can be performed in parallel because of the global large-area down holes 1810. As shown at 1801, a 2×2 plastic carrier 1815 can also be pre-fabricated. Next, as shown at 1802, individual chips can be aligned to the mold and integrated to create a large area CiC 1820. All 4 chips are now aligned to the global large area pin-holes of the plastic carrier. Next, as shown at 1803, the parallel deposition of electrodes on all 4 devices is facilitated by a large-area shadow mask 1825. As shown at 1804 in FIG. 18b, the fluidic cap integration can be parallelized by use of a large area fluidic cap 1830. The result of combining these items (as shown at 1806) is a large-area substrate 1835. The final step 1807 is to dice the large-area substrate 1835 individual devices 1840.

Integration with Test Apparatus and End-Use

In another aspect of the invention, an apparatus capable of electrically and/or fluidically addressing the chip is aligned with the global alignment features of the packaged chip. It will be understood that those persons skilled in the art would consider a suitable apparatus as being one that can minimally electrically or fluidically address the chip. The alignment properties of the process or packaging described herein can allow for easy electrical and fluidic testing or interfacing. The test or operational socket of a device can be designed to easily swap in and out devices, similar to a zero-insertion force sockets for integrated circuits. The socket can be designed for repeated use.

The devices and methods described herein are applicable to a variety of different biosensor and bio-device systems, including but not limited to impedance and charge sensing nanopores, fluorescence microarrays, electrochemical microarrays, and MEMS based biosensors.

The devices and methods of the present disclosure can be used with electrochemical and ion-sensing based microarrays such as those described in U.S. Pat. No. 6,444,111, U.S. Pat. No. 8,673,627, and US Patent Publication No. 20140045701, each of which is incorporated herein by reference in its entirety for all purposes. In some cases, the methods and devices of the present disclosure reduce the cost and die size for these end-uses.

The devices and methods of the present disclosure can be used with CMOS fluorescence microarray based biosensors such as described in US Patent Publication No. 20100122904, which is incorporated herein by reference in its entirety for all purposes. In some cases, large areas and/or the 3D electrodes on the bottom side of the chip as described herein are ideally suited for these devices where the active area of the device needs to be simultaneously optically illuminated and electrically measured. The bottom side electrodes can be particularly useful for creating a very compact consumable cartridge. Furthermore, the plastic substrate can be made with an optically black material to reduce reflectance of the packaging.

The devices and methods of the present disclosure can be used with impedance and charge sensing pore based biosensors arrays such as described in US Patent Publication No. 20140221249, U.S. Pat. No. 8,828,208 and U.S. Provisional Patent Ser. No. 62/014,595 filed on Jun. 19, 2014, each of which is incorporated herein by reference in its entirety for all purposes. In some cases, the 3D integration described herein offers a solution for alignment of a microfluidic channel to both the top and bottom of these membrane based biosensors. The components can also be screen printed with electrode materials, such as Ag/AgCl, which can be used for the operation of these devices.

Figure 19A:
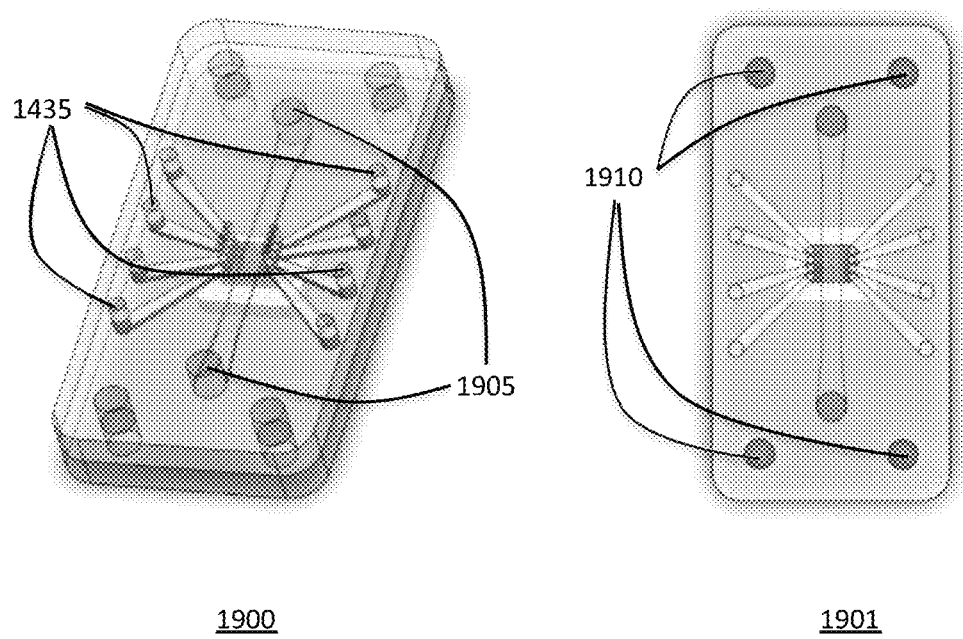
FIG. 19a, FIG. 19b and FIG. 19c show an example of a test socket.

An example of a test socket is shown in FIG. 19a. As an example, a device with injection molded electrodes and external alignment pins is shown from a perspective view at 1900. The electrodes 1435 and fluidic ports 1905 are highlighted. Top down view 1901 is shown to highlight the dowel-holes 1910 for alignment in the test socket.

Figure 19B:
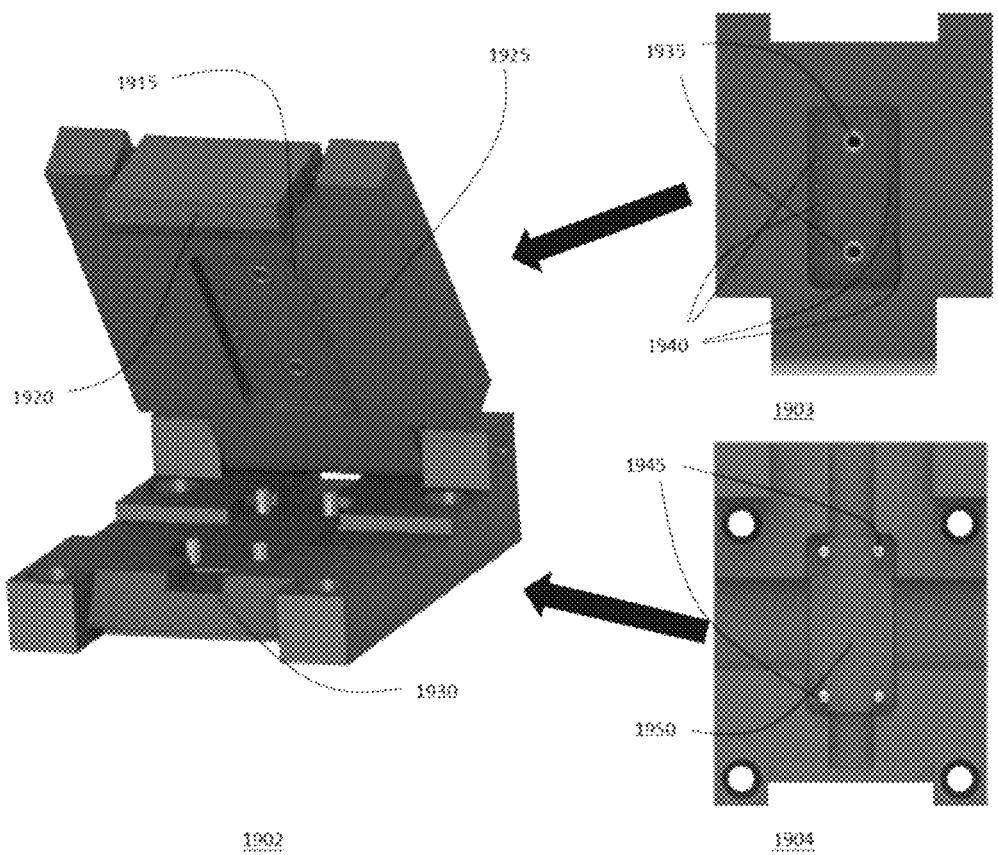

A perspective drawing of a test socket is shown at 1902 in FIG. 19b, and includes the lid, latch and base. For reference, the test socket is referred to at 1915; the latch is referred to at 1920; the lid is referred to at 1925; the base is referred to at 1930; the fluidic injection or vacuum ports are referred to at 1935; the electrical contacts are referred to at 1940; the dowel pins for alignment are referred to at 1945; and the recess for the chip is referred to at 1950.

An under-side view 1903 of the lid with ports for fluid interface and electrical contact for electric interface is shown. Either of these can also be placed on the lid due to the 3D nature of the packaging. A top-down view of the base 1904 shows alignment pins used throughout the processes. These alignment pins can be used to align the device to the (pogo-pin) electrical contacts. A similar design can be implemented where the pogo-pins are also on the bottom (e.g., in the case where 3D interconnects are used). Alignment pins can be used as part of the coarse or fine alignment. In some cases, alignment of the electrodes on the chip to the pin electrodes on the socket is a coarse alignment.

Figure 19C:
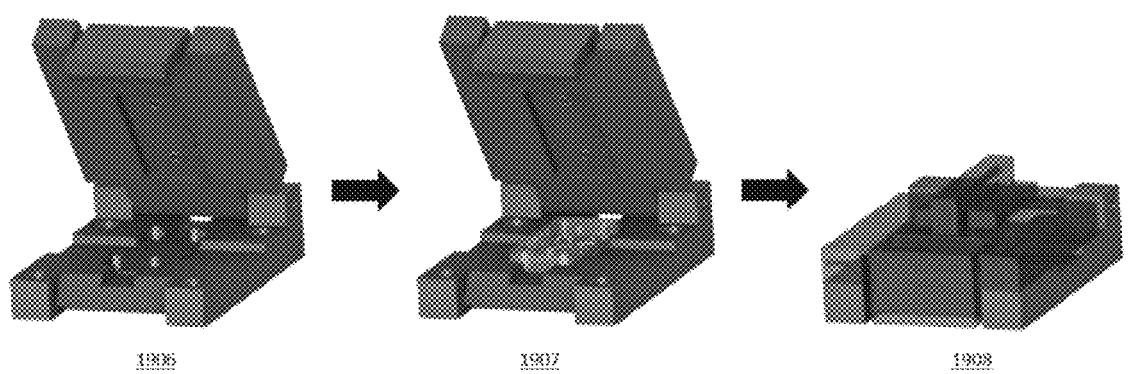

As shown in FIG. 19c, operation of the test socket includes an empty socket 1906, a device placed in the socket 1907, and the cap being closed 1908, creating fluid and electrical connections to the device.

Control Systems

The present disclosure provides computer control systems that can be employed to regulate or otherwise control the methods and systems provided herein. A control system of the present disclosure can be programmed to control process parameters to, for example, perform an alignment.

Figure 20:
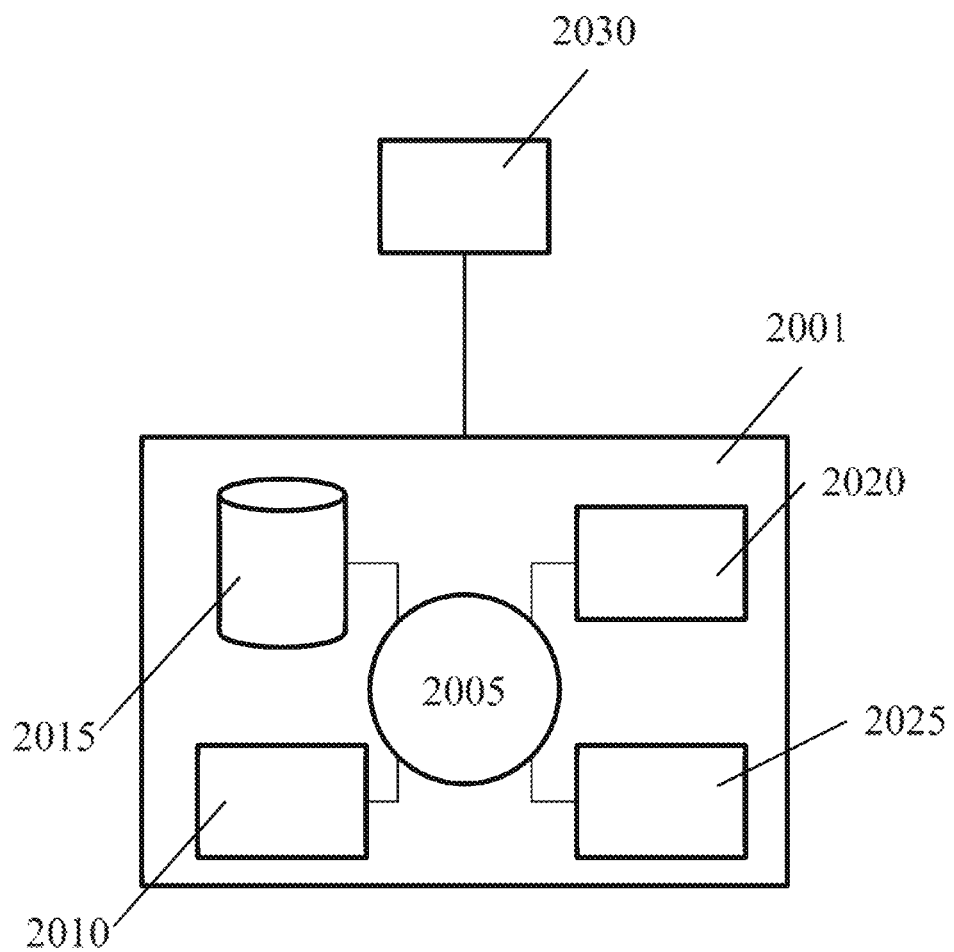
FIG. 20 shows an example of a computer system for controlling the manufacture of and/or operation of the device of the present disclosure.

FIG. 20 shows a computer system 2001 that is programmed or otherwise configured to regulate the production and/or operation of the device. The computer system 2001 can regulate, for example, flow rates, temperatures, pressures, mechanical manipulations, applied voltages or other electrical inputs and/or outputs, and the like.

The computer system 2001 includes a central processing unit (CPU, also "processor" and "computer processor" herein) 2005, which can be a single core or multi core processor, or a plurality of processors for parallel processing. The computer system 2001 also includes memory or memory location 2010 (e.g., random-access memory, read-only memory, flash memory), electronic storage unit 2015 (e.g., hard disk), communication interface 2020 (e.g., network adapter) for communicating with one or more other systems, and peripheral devices 2025, such as cache, other memory, data storage and/or electronic display adapters. The memory 2010, storage unit 2015, interface 2020 and peripheral devices 2025 are in communication with the CPU 2005 through a communication bus (solid lines), such as a motherboard. The storage unit 2015 can be a data storage unit (or data repository) for storing data.

The CPU 2005 can execute a sequence of machine-readable instructions, which can be embodied in a program or software. The instructions may be stored in a memory location, such as the memory 2010. Examples of operations performed by the CPU 2005 can include fetch, decode, execute, and writeback.

The storage unit 2015 can store files, such as drivers, libraries and saved programs. The storage unit 2015 can store programs generated by users and recorded sessions, as well as output(s) associated with the programs. The storage unit 2015 can store user data, e.g., user preferences and user programs. The computer system 2001 in some cases can include one or more additional data storage units that are external to the computer system 2001, such as located on a remote server that is in communication with the computer system 2001 through an intranet or the Internet.

The computer system 2001 can be in communication with a system 2030, including a chip with integrated fluidics and/or process elements. Such process elements can include sensors, flow regulators (e.g., valves), and pumping systems that are configured to direct a fluid.

Methods as described herein can be implemented by way of machine (e.g., computer processor) executable code stored on an electronic storage location of the computer system 2001, such as, for example, on the memory 2010 or electronic storage unit 2015. The machine executable or machine readable code can be provided in the form of software. During use, the code can be executed by the processor 2005. In some cases, the code can be retrieved from the storage unit 2015 and stored on the memory 2010 for ready access by the processor 2005. In some situations, the electronic storage unit 2015 can be precluded, and machine-executable instructions are stored on memory 2010.

The code can be pre-compiled and configured for use with a machine have a processor adapted to execute the code, or can be compiled during runtime. The code can be supplied in a programming language that can be selected to enable the code to execute in a pre-compiled or as-compiled fashion.

Aspects of the systems and methods provided herein, such as the computer system 2001, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

EXAMPLES

Below are various non-limiting examples of uses and implementations of systems of the present disclosure.

Example 1: Formation of a Chip-in-Carrier (CiC)

Figure 21:
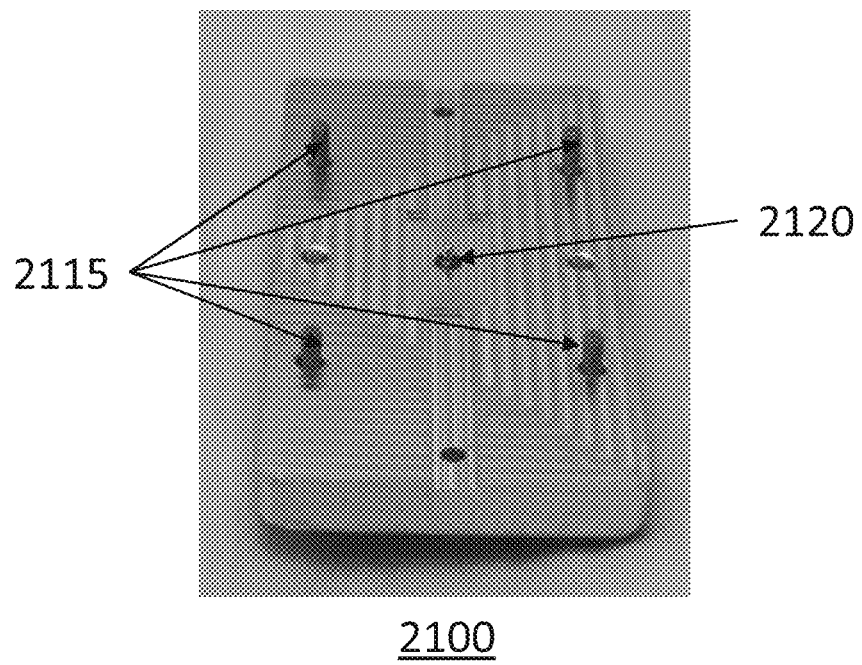
FIG. 21 shows an example of a planarization jig of the present disclosure.
Figure 21:
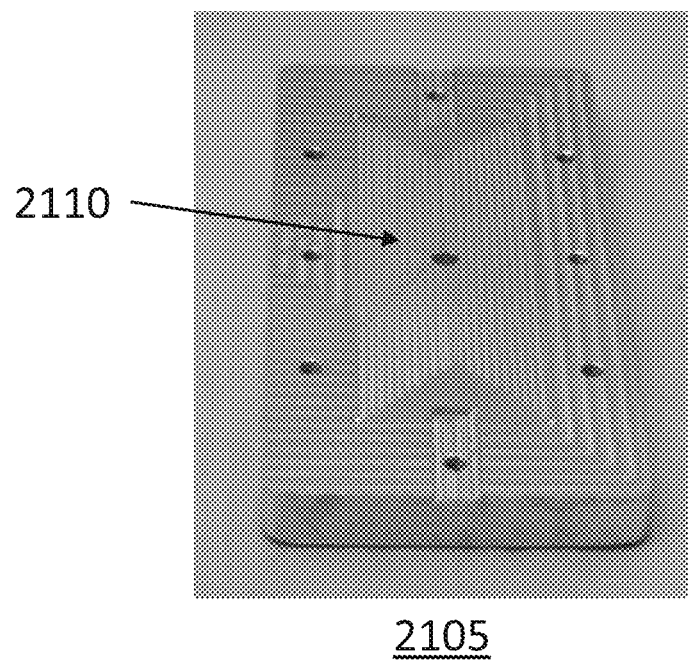

FIG. 21 shows an example of a top plate 2100 and a bottom plate 2105 of a planarization jig. The surfaces have recesses 2110 to accommodate the chip and carrier. Screws 2115 can be used to apply pressure to the carrier and a spring plunger 2120 can be used to apply pressure to the chip to push the carrier and chip onto the planarizing surface.

Figure 22:
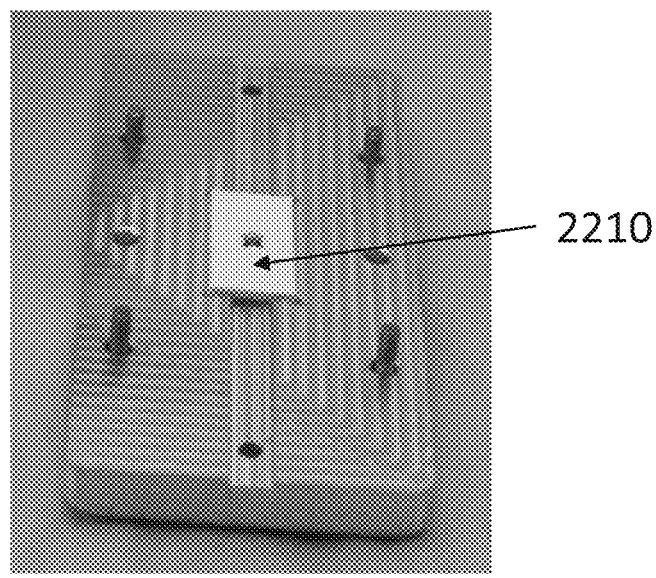
FIG. 22 shows an example of a planarization jig of the present disclosure with a glass slide and substrate.
Figure 22:
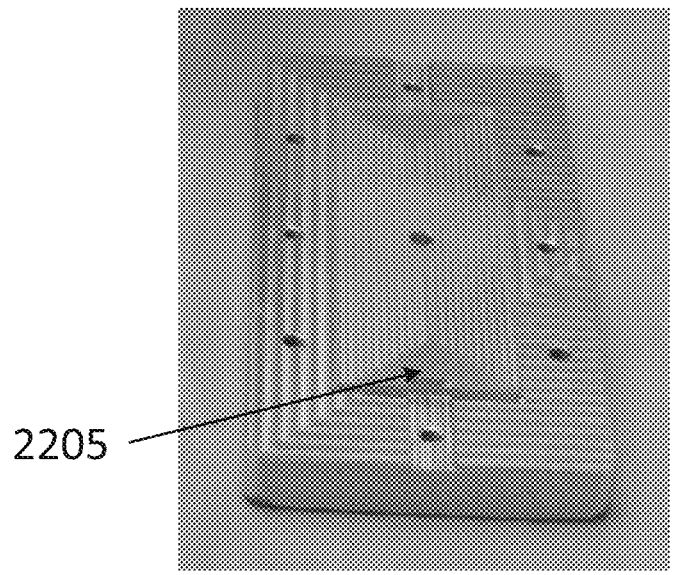

With reference to FIG. 22, a planarizing glass slide 2205 can be placed in contact with one face of the jig and a plastic carrier 2210 can be placed in contact with the other face of the jig.

Figure 23:
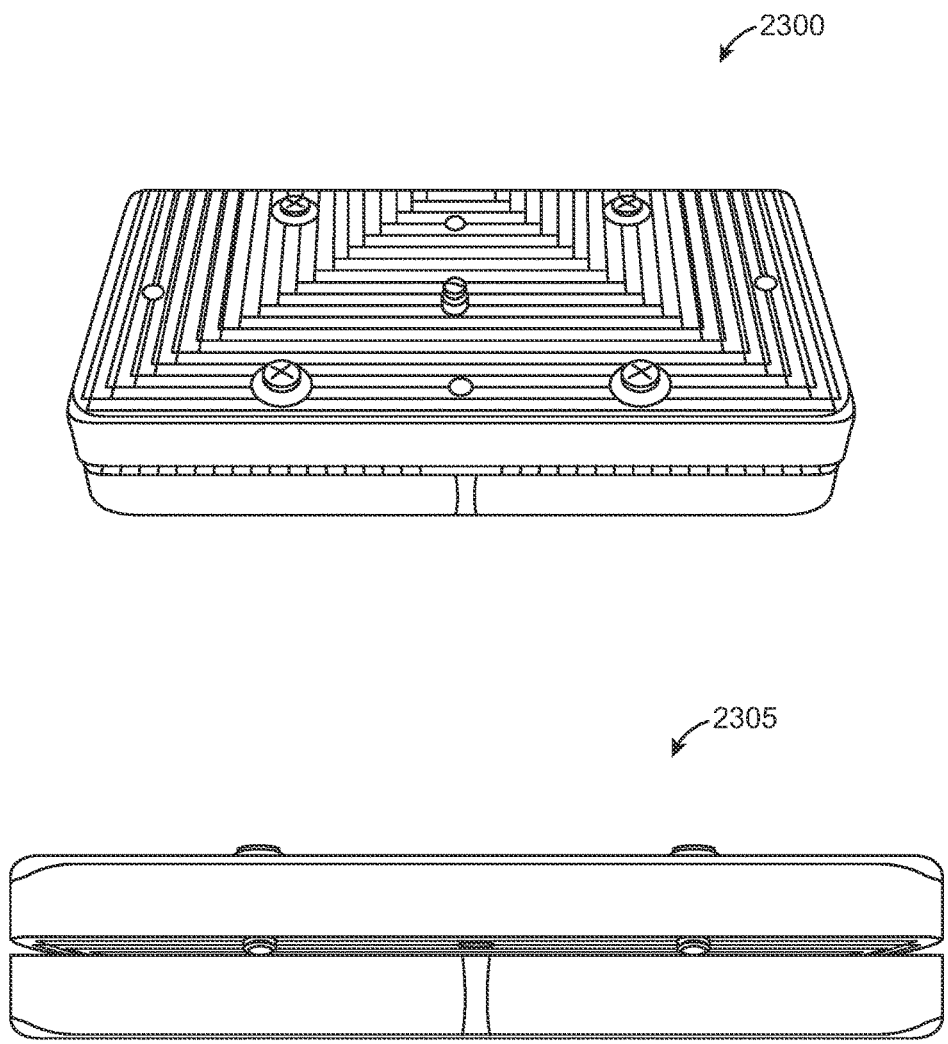
FIG. 23 shows an example of an assembled planarization jig of the present disclosure.

With reference to FIG. 23, the two plates of the jig can be assembled for creation of a chip-in-carrier (CiC) as shown in a perspective view 2300 and a profile view 2305.

Figure 24:
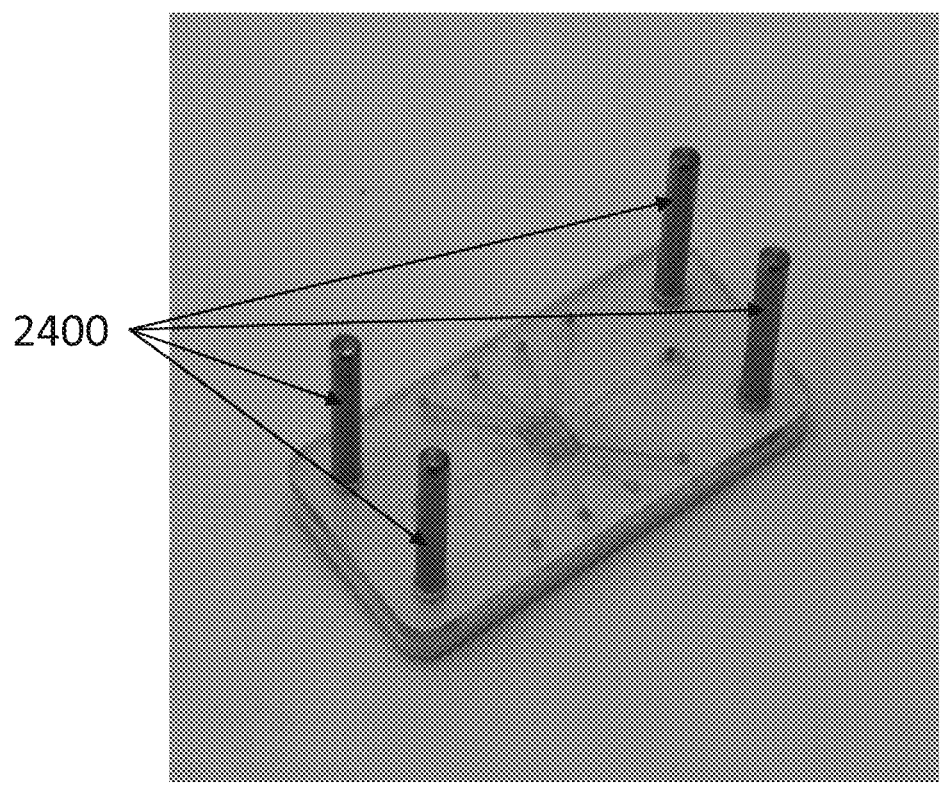
FIG. 24 shows an example of the assembly of a fluidic cap to the chip-in-carrier (CiC)

Example 2: Assembly and Testing of an Electrically Addressable Chip with Integrated Fluidics The CiC produced according to Example 1 has four holes near each of its four corners that can be used for alignment of a fluidic cap, which also has corresponding holes (i.e., alignment features). FIG. 24 shows alignment of the fluidic cap to the CiC by placing dowels 2400 through each of the alignment holes. The fluidic cap is aligned to the CiC with an accuracy of about 20 µm.

Figure 25:
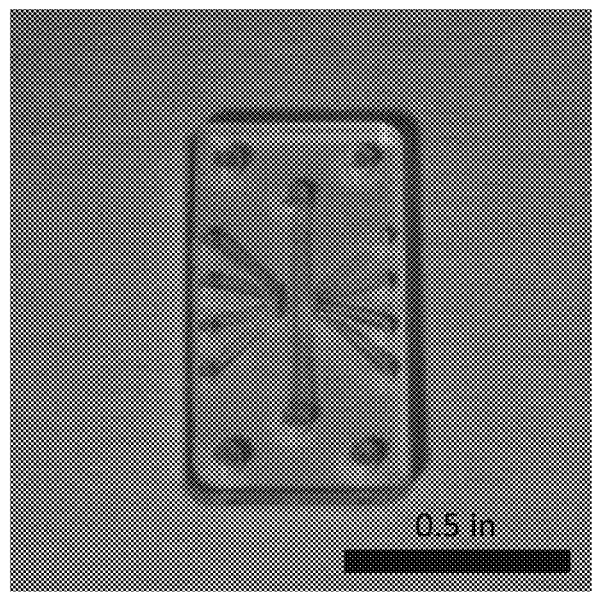
FIG. 25 shows an example of injection of an electrode into a fluidic channel of a fluidic cap.
Figure 25:
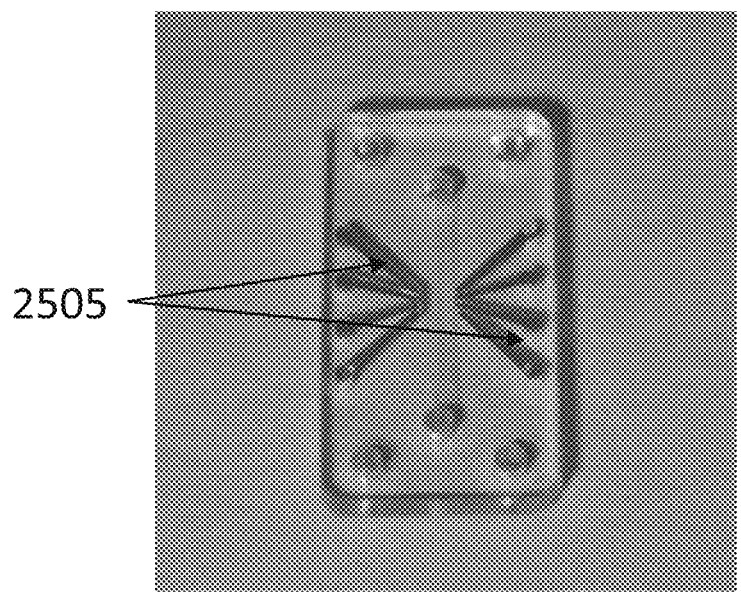
Figure 26:
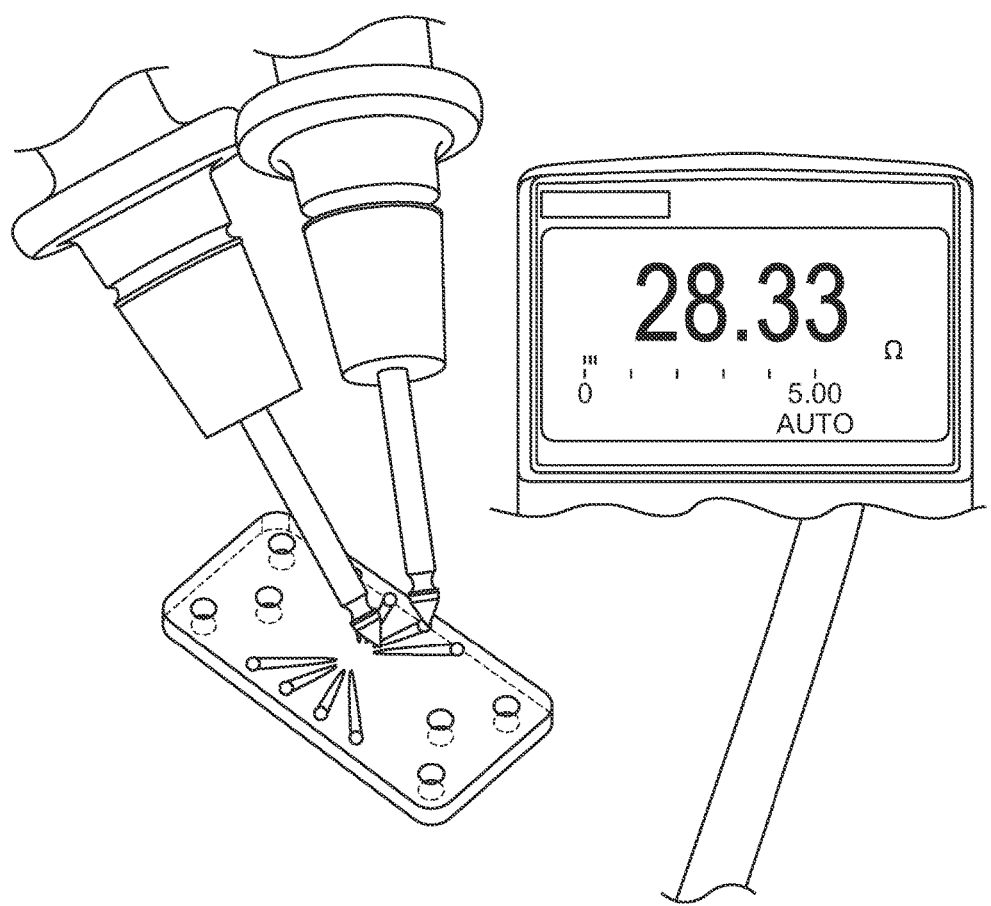
FIG. 26 shows an example of a resistance measurement of an electrode.

With reference to FIG. 25, the fluidic cap is bonded to the CiC by optical adhesive boding in this example to produce a packaged chip with integrated fluidics 2500. A solution of silver epoxy is injected into the fluidic channels of the fluidic cap to create electrodes 2505 that contact the chip and produce an electrically addressable, packaged chip having integrated fluidics 2510. As shown in FIG. 26, the electrodes can complete an electrical circuit, in this case having a resistance of 28.33 ohms.

It should be understood from the foregoing that, while particular implementations have been illustrated and described, various modifications can be made thereto and are contemplated herein. For example, the embodiments described herein can be combined with or modified by elements described in "Wafer Scale Integration of CMOS Chips for Biomedical Applications via Self-Aligned Masking" by Uddin et. al. IEEE Trans. on Components, Packaging and Manufacturing Tech., December 2011 to yield yet more embodiments of the present invention. It is also not intended that the invention be limited by the specific examples provided within the specification. While the invention has been described with reference to the aforementioned specification, the descriptions and illustrations of the preferable embodiments herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents. It is intended that the following claims define the scope of the invention and that methods and structures within the scope of these claims and their equivalents be covered thereby.

What is claimed is:
1. A method for packaging a chip, the method comprising:
   (a) placing a chip and a carrier on a planarizing surface, wherein the chip comprises a first surface having an electrode therein and a second surface, wherein the chip is placed face down against the planarizing surface such that said first surface is adjacent to said planariz- ing surface, and wherein the carrier surrounds the chip with a gap between the carrier and the chip;

(b) closing the gap to bond the carrier and side surfaces between the first surface and the second surface of the chip, thereby producing a chip-in-carrier (CiC); and (c) releasing the CiC from the planarizing surface, thereby exposing said first surface.

2. The method of claim 1, wherein the chip is placed on the planarizing surface prior to placing the carrier on the planarizing surface.

3. The method of claim 1, wherein the gap is between about 10 μm and about 50 μm wide.

4. The method of claim 1, wherein the chip is treated to enhance bonding between the chip and the carrier.

5. The method of claim 1, wherein the gap is closed in (b) by heating the carrier such that the carrier melts or deforms to close the gap.

6. The method of claim 1, wherein the gap is closed in (b) by contacting the carrier with a solvent such that the carrier dissolves or deforms to close the gap.

7. The method of claim 1, wherein the gap is closed in step (b) by injecting an adhesive into the gap.

8. The method of claim 1, wherein the first surface of the chip has a first alignment feature, the planarizing surface has a second alignment feature, and the chip is placed on the planarizing surface in step (a) such that the first alignment feature is aligned with the second alignment feature.

9. The method of claim 1, wherein the carrier is aligned to the planarizing surface.

10. The method of claim 1, wherein the carrier is injection molded onto the planarizing surface and the injection molded carrier comprises pins or holes that have a known alignment relative to the chip.

11. The method of claim 1, wherein the chip is aligned relative to the carrier in the chip-in-carrier (CiC) with an accuracy of about 1 μm to about 100 μm.

12. The method of claim 1, further comprising attaching a fluidic cap to the carrier in the chip-in-carrier (CiC), wherein the fluidic cap is adjacent to the first surface of the chip.

13. The method of claim 1, further comprising depositing an additional electrode on the CiC that electrically addresses the chip, wherein the additional electrode is deposited onto the first surface of the chip.

14. The method of claim 1, wherein the carrier is placed on the planarizing surface prior to placing the chip on the planarizing surface.

* * * * *

UNITED STATES PATENT AND TRADEMARK OFFICE
CERTIFICATE OF CORRECTION

PATENT NO. : 9,929,065 B2
APPLICATION NO. : 15/263649
DATED : March 27, 2018
INVENTOR(S) : Kaveh M. Milaninia It is certified that error appears in the above-identified patent and that said Letters Patent is hereby corrected as shown below:

In the Claims

Claim 1, Column 21, Line 2, please delete "and the chip;" and replace it with -- and side surfaces between the first surface and the second surface of the chip; --

Claim 1, Column 21, Lines 3-5, please delete "and side surfaces between the first surface and the second surface of the chip," and replace it with -- to the chip, --

Signed and Sealed this
Fifteenth Day of May, 2018

Andrei Iancu
*Director of the United States Patent and Trademark Office*